United States Patent [19]

Yoshikawa et al.

[11] Patent Number: 4,672,149
[45] Date of Patent: Jun. 9, 1987

[54] PHOTOELECTRIC TRANSDUCER ELEMENT

[75] Inventors: Masao Yoshikawa, Numazu; Akio Kojima, Hiratsuka; Tetsuro Suzuki, Fuji; Masaomi Sasaki, Susono, all of Japan

[73] Assignee: Ricoh Co., Ltd., Tokyo, Japan

[21] Appl. No.: 815,836

[22] Filed: Jan. 3, 1986

[30] Foreign Application Priority Data

Jan. 18, 1985 [JP] Japan ................................. 60-7207

[51] Int. Cl.$^4$ ........................................... H01L 31/06
[52] U.S. Cl. ................................................... 136/263
[58] Field of Search ........................................ 136/263

[56] References Cited

U.S. PATENT DOCUMENTS 4,279,981 7/1981 Ohta et al. ............................ 430/73

FOREIGN PATENT DOCUMENTS 53-132346 11/1978 Japan .
53-133445 11/1978 Japan .

Primary Examiner—Aaron Weisstuch
Attorney, Agent, or Firm—Flynn, Thiel, Boutell & Tanis

[57] ABSTRACT

The present invention relates to a photoelectric transducer element comprising a light-transmissive front electrode, a photo-active layer and a back electrode, characterized in that said photo-active layer contains an azo compound expressed by the general formula (I),

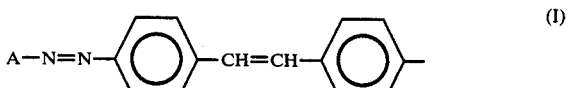
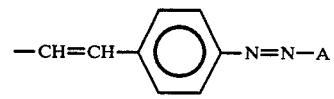

(I)

wherein A represents a coupler residue.

18 Claims, 6 Drawing Figures

PHOTOELECTRIC TRANSDUCER ELEMENT

BACKGROUND OF THE INVENTION

1. Field of the Invention

The present invention relates to an organic photoelectric transducer element (organic solar cell) using an organic photoconductive material, and can be applied to the technical field of a light sensor, image sensor and the like.

2. Description of the Prior Art

Heretofore, there have been prepared various photoelectric transducer elements using an inorganic semiconductor. The desired photoelectric transducer element should have the properties of (i) efficient and high transducing performance and (ii) low cost. It is difficult to say that the conventional photoelectric transducer elements using single crystal Si, GaAs, amorphous Si or the like satisfy the above mentioned second property (ii).

Recently, in order to avoid the above mentioned defects, the preparation of a photoelectric transducer using an organic semic-conductor has been proposed. Examples of these organic semi-conductor layers used for this purpose include as follows:

a. a merocyanine dye layer coated by a spinner (see Japanese Laid Open Patent Nos. 51-122389 and 53-131782);

b. a phthalocyanine vapor deposited layer or a layered structure of an electron donor layer such as ovalene and the like and an electron acceptor layer such as a pyrylium type dye and the like (see Japanese Laid Open Patent No. 54-27787);

c. a eutectic crystal complex layer formed by a pyrylium type due and a polycarbonate (see Japanese Laid Open Patent No. 54-27387);

d. a layer prepared by dispersing a non-metallic phthalocyanine in a binder (see Japanese Laid Open Patent No. 55-9497);

e. a layered structure of n-type silicon and a p-type doped polyacetylene thin film (see Japanese Laid Open Patent Nos. 55-130182 and 55-138879); and f. a vapor-deposited merocyanine dye layer (see Japanese Laid Open Patent No. 56-35477).

These organic photoelectric transducer elements having a large area can be cheaply prepared by coating a substrate with a solution or dispersion prepared by dissolving or dispersing an organic semi-conductor in a solvent or by vapor-depositing an organic semi-semi-conductor at a low temperature on a substrate and further applying an electroconductive layer thereon. However, these conventional transducer elements have the disadvantage that the transducing efficiency is too low for practical use.

SUMMARY OF THE INVENTION

An object of the present invention is to provide a cheap photoelectric transducer element using an organic photoelectric transducer layer having azo pigment dispersed therein and having such properties as high transducing efficiency, flexibility, and large scale.

That is, an object of the present invention is to provide a photoelectric transducer element comprising a light-transmissive front electrode, a photo-active layer and a back electrode, characterized in that said photoactive layer contains an azo compound expressed by the general formula (I),

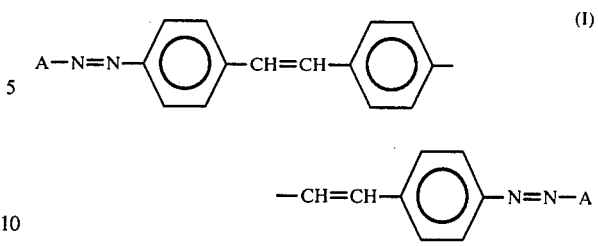

wherein A represents a coupler residue.

BRIEF DESCRIPTION OF THE DRAWINGS

FIGS. 1(a), 1(b), 2(a), 2(b), 2(c) and 2(d) are sectional views illustrating various embodiments of the photoelectric transducer element of the present invention.

DETAILED DESCRIPTION OF THE PRESENT INVENTION

The photoelectric transducer element of the present invention comprises a photo-active layer sandwiched between two electrodes (front electrode and back electrode), said photo-active layer containing an azo compound expressed by the general formula (I)

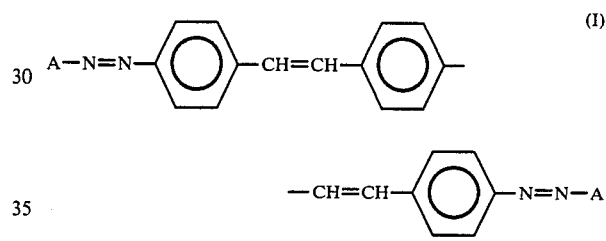

wherein A represents a coupler residue which is fully described hereinafter.

The photoelectric transducer element used as a solar cell is fully illustrated hereinafter in accordance with the accompanying drawings.

Figure 1A:
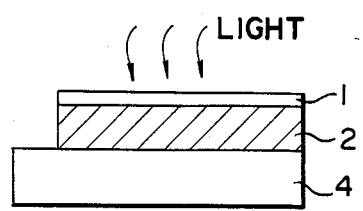

FIG. 1(a) illustrates a basic structure of the photoelectric transducer element of the present invention, wherein the azo pigment-containing photo-active layer 2 is sandwiched between two electrodes, i.e. a front electrode 1 and a back electrode 4. Light enters from the front electrode side, and accordingly the front electrode 1 must be transparent to light.

Each front electrode and back electrode can be used alone or may be provided with a substrate or a protective layer.

Figure 2A:
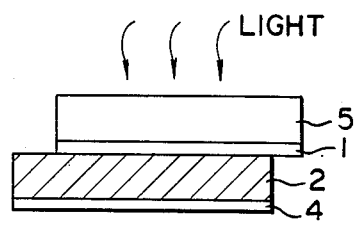

FIG. 2(a) illustrates an example of a case where a front electrode 1 is provided with a protective layer 5.

Figure 3A:
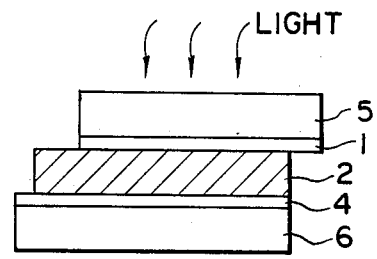

FIG. 3(a) illustrates an example of a case where a front electrode 1 is provided with a protective layer 5 and a back electrode 4 is also provided with a substrate 6.

In both embodiments illustrated by FIGS. 2(a) and 3(a), the protective layer 5 on the front electrode must be transparent to light.

Both front electrode and back electrode are connected with an external circuit by a lead wire or the like for practical use.

Figure 1B:
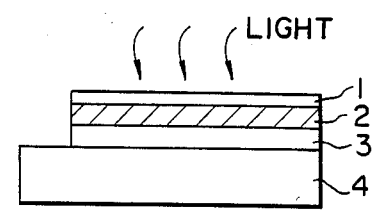
Figure 2B:
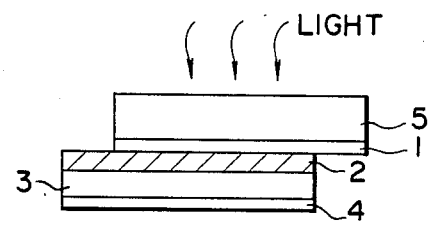
Figure 3B:
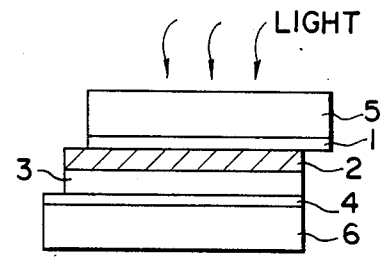

The photo-active layer is not always a mono-layer, but may comprise two or more layers. FIGS. 1b, 2b and 3b illustrate examples of a photo-active layer comprising two layers. A photo-active layer 3 may be a layer which generates charge by light in the same manner as in a photo-active layer 2, or it may be a layer which efficiently transfers charge generated by the photo-active layer 2. FIG. 1b illustrates an example wherein the photo-active layer 2 comes in contact with the front electrode 1, but the photo-active layer 3 may come in contact with the front electrode 1. A photo-active layer may comprise plural layers respectively containing different pigments.

The essential feature of the present invention resides in said photo-active layer 2. The photo-active layer 2 generates positive holes and electrons by light irradiation. In order to effect this phenomenon, it is necessary that an electric field is present in the layer. This condition is achieved by externally applying voltage between the front electrode and the back electrode or by transferring hot carriers by a difference in Fermi level (or work function) when a photo-active layer 2 comes in contact with a front or back electrode or a photo-active layer 3 without applying external voltage.

The photo-active layer 2 is a layer containing the following azo pigment as the main component.

As disclosed in Japanese Laid Open Patent Nos. 53-133445, 53-132347 and the like, an azo pigment is known to be useful as a light carrier-generating material for an electrophotographic element. We have found that these materials provide quite favorable properties when used as a photoelectric transducer element. The photoelectric transducer element referred to herein causes electromotive force or electric current or both of these to be generated when the element is subjected to light irradiation without applying external voltage between the front electrode and the back electrode as shown in FIG. 1, and generates a large photoelectric current in the presence of external voltage.

As mentioned above, this photo-active layer contains the azo pigment. The azo pigment may be contained alone, or may be contained as a dispersion in resin as listed below. The photo-active layer may further contain an additive as mentioned below. The azo pigment is dispersed in resin in such a manner as to make a weight ratio of pigment/resin = 10/0 − 1/4, preferably 10/0 − ½. Charge generally transfers by way of pigments. If the amount of resin is increased too much, the transferring of the charge generated becomes hard. The additive is used in order to improve the transferring efficiency of the charge generated in the photo-active layer 2 or to improve the generating efficiency of charge by light. The photoelectric current generally increases by the incorporation of the additive, but sometimes an adverse effect is produced. Therefore, the combination of a pigment with an additive must be appropriately selected.

The amount of the additive is suitably 5-50% by weight, based on the total weight of pigment and resin.

A photo-active layer containing the claimed azo pigment as the essential component, according to the present invention, suitably has a film thickness of 0.01-10 μm. The most suitable film thickness is 0.05-3.0 μm although this value varies depending on the kinds of azo pigment and resin used. If this layer is too thin, the amount of light absorption becomes small and the probability of pin holes occurring between the front and back electrodes becomes high. On the contrary, if this layer is too thick, the distances through which the positive holes or electrons must travel to reach the electrodes become long, and therefore the probability of deactivation becomes high, and the efficiency is lowered.

The photo-active layer of the present invention is formed on the back electrode or the front electrode, the back electrode support or the front electrode being provided with a support, by coating a solution of the azo pigment dissolved in a solvent, such an an organic amine, or a uniform slurry prepared by mixing the azo pigment in an appropriate solvent, if necessary, together with the resin and grinding the pigment by means of a ball mill and the like.

The photoactive layer thus formed has a strong photosensitivity wavelength zone or spectral range to visible light, and produces a high open-circuit voltage (Voc) and a high short-circuit electric current (Jsc) in the absence of external voltage. These values produced are cnsiderably high for an organic material. The conversion efficiency ($\eta$) is determined by the following formula.

$$\eta = 100 \times \frac{Voc \times Jsc \times ff}{Pin}$$

(Pin = incident light energy; ff = fill factor)

The photoelectric transducer element of the present invention has a relatively high conversion efficiency compared to other elements that use an organic material as a photo-active component. This is due to the azo pigment. The azo pigment generally has a high quantum efficiency in the internal electric field formed in the junction region. It is presumed that a large Jsc value is obtained because of this high quantum efficiency. When an external voltage is applied, a large photoelectric current is produced due to the above mentioned high quantum efficiency. Accordingly, a photoelectric transducer element with excellent sensitivity is obtained. With regard to the front electrode and its support:

Examples of materials usable as a front electrode include semi-transparent metals such as aluminum, lead, zinc, tantalum, nickel, titanium, cobalt, niobium, copper, Hastelloy C, gold, platinum, silver, palladium and the like; and metallic oxides such as tin oxide, indium-tin-oxide (ITO) and the like.

Examples of materials usable as a support for the first electrode include glass, transparent plastic film and the like. With regard to the back electrode and its support:

Almost all metals can be used as the back electrode. With regard to the photo-active layer 3:

The photo-active layer 3 is: type (a) a layer containing charge generating pigments other than the pigment used for forming the photo-active layer 2, in order to compensate the azo pigment of the photo-active layer 2 for a lower photosensitive wavelength zone; (b) a layer for forming a junction barrier with the photo-active layer 2; or (c) a layer for efficiently transferring either positive holes or electrons generated in the photo-active layer 2.

The above-mentioned layer 3, type (a) can be prepared in the same manner as the photo-active layer 2 by coating a pigment, such as a phthalocyanine type pigment, a perylene type pigment, an aromatic polycycloquinone pigment, a thioindigo pigment, quinacridone pigment or the like.

The above mentioned layer 3, type (b) can be prepared by dispersing particles of zinc oxide, titanium oxide, cadmium sulfide, selenium crystal, lead oxide or the like in a binder resin.

The above mentioned layer 3, type (c) can be prepared by mixing an electron donor listed below as a positive hole transfer material or an electron acceptor listed below as an electron transfer material in an appropriate resin.

The azo pigment used as the essential active component for the indispensable photo-active layer has the general formula (I),

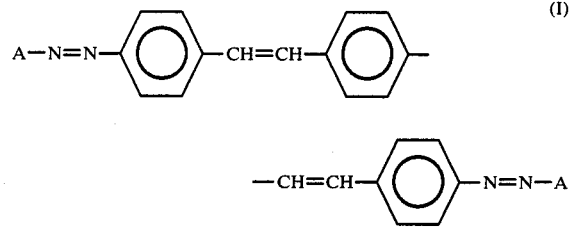

wherein A represents a coupler residue.

Examples of the coupler used for preparing the disazo compound expressed by the general formula (I) include a hydroxyl group-containing heterocyclic compound and a hydroxyl group-containing aromatic hydrocarbon compound such as phenol type, naphthol type compounds and the like; an amino group-containing aromatic hydrocarbon compound and an amino group-containing heterocyclic compound; an aromatic hydrocarbon compound and a heterocyclic compound having an amino group and a hydroxyl group such as aminonaphthols; a compound having an aliphatic or aromatic enol type ketone group (compound having an active methylene group) and the like. Preferably, the coupler residue A is expressed by the following general formulas (II), (III), (IV), (V), (VI), (VII), (VIII), (IX), (X), (XI) or (XII).

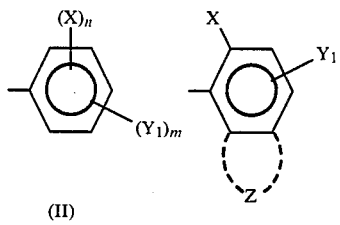

(II)

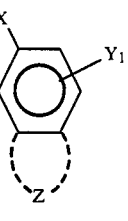

(III)

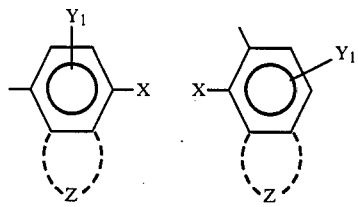

(IV)

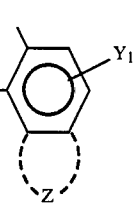

(V)

wherein X, $Y_1$, Z, m and n in the above formula (II), (III), (IV) and (V) represent the following groups:

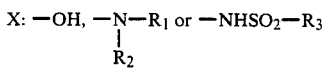

(wherein $R_1$ and $R_2$ represent hydrogen or a substituted or non-substituted alkyl group, and $R_3$ represents a substituted or non-substituted alkyl or a substituted or non-substituted aryl group); $Y_1$: hydrogen, halogen, substituted or non-substituted alkyl group, substituted or non-substituted alkoxy group, carboxyl group, sulfo group, substituted or non-substituted sulfamoyl group or

(wherein $R_4$ represents hydrogen, alkyl group substituted alkyl group, phenyl group or substituted phenyl group, and $Y_2$ represents cyclic hydrocarbon group, substituted cyclic hydrocarbon group, heterocyclic group or its substituted heterocyclic group, or

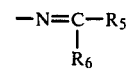

wherein $R_5$ represents a cyclic hydrocarbon group substituted cyclic hydrocarbon group, heterocyclic group, substituted heterocyclic group, styryl group substituted styryl group, and $R_6$ represents hydrogen, alkyl group, phenyl group or their substituted group, or $R_5$ and $R_6$ may form a ring with the carbon bonded thereto);

Z: cyclic hydrocarbon group, substituted cyclic hydrocarbon group, heterocyclic group or substituted heterocyclic group;

n: an integer of 1 or 2; and m: an integer of 1 or 2.

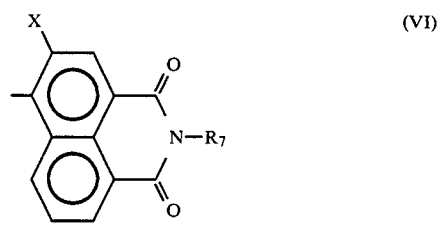

(VI)

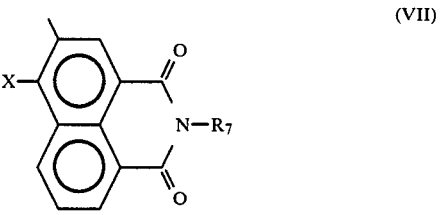

(VII)

wherein $R_7$ in the above formula (VI) and (VII) represents a substituted or non-substituted hydrocarbon group, and X is the same as mentioned above.

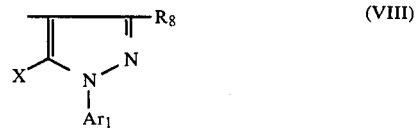

(VIII)

wherein $R_8$ represents an alkyl group, carbamoyl group, carboxyl group or its ester, and $Ar_1$ represents a cyclic hydrocarbon group or substituted cyclic hydrocarbon group, and X is the same as mentioned above.

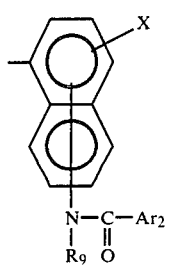

(IX)

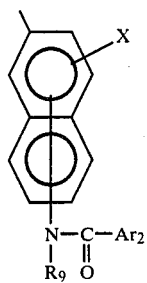

(X)

wherein $R_9$ in the above formulas (IX) and (X) represents hydrogen or a substituted or non-substituted hydrocarbon group, and $Ar_2$ represents a cyclic hydrocarbon group or substituted cyclic hydrocarbon group.

Examples of the cyclic hydrocarbon expressed by Z in the above general formulas (II), (III), (IV) or (V) include a benzene ring, a naphthalene ring and the like, and examples of the heterocycle expressed by the same include an indole ring, a carbazole ring, a benzofuran ring and the like. Examples of the substituent of the ring expressed by Z include a halogen atom such as chlorine, bromine, and the like, and an alkoxy group, and the like.

Examples of the cyclic hydrocarbon group expressed by $Y_2$ or $R_5$ include phenyl, naphthyl, anthryl, pyrenyl and the like, and examples of the heterocyclic group expressed by the same include pyridyl, thienyl, furyl, indolyl, benzofuranyl, carbazolyl, dibenzofuranyl and the like. Examples of the ring formed by bonding $R_5$ and $R_6$ include fluorene ring.

Examples of the substituents for the cyclic hydrocarbon group or heterocyclic group expressed by $Y_2$ or $R_5$ or for the ring formed by bonding $R_5$ and $R_6$ include an alkyl group such as methyl, ethyl, propyl, butyl or the like; an alkoxy group such as methoxy, ethoxy, propoxy, butoxy or the like; a halogen atom such as chlorine, bromine or the like; a dialkyl amino group such as dimethyl amino, diethyl amino or the like; a diaralkyl amino group such as dibenzyl amino or the like; a halomethyl group such trifluoromethyl or the like; nitro group; cyano group; carboxyl group or its ester; hydroxyl group; sulphonate group such as —$SO_3Na$; and the like.

Examples of the substituent for the phenyl group expressed by $R_4$ include a halogen atom such as chlorine or bromine.

Examples of the hydrocarbonyl group expressed by $R_7$ or $R_9$ include an alkyl group such as methyl, ethyl, propyl, butyl and the like; an aralkyl group such as benzyl and the like; an aryl group such as phenyl; or their substituted groups.

Examples of the substituent for the hydrocarbonyl group expressed by $R_7$ or $R_9$ include an alkyl group such as methyl, ethyl, propyl, butyl and the like; an alkoxy group such as methoxy, ethoxy, propoxy, butoxy and the like; a halogen atom such as chlorine, bromine and the like; hydroxyl group; nitro group; and the like.

Examples of the cyclic hydrocarbon group expressed by $Ar_1$ or $Ar_2$ include phenyl, naphthyl and the like, and examples of the substituents for these groups include an alkyl group such as methyl, ethyl, propyl, butyl or the like; an alkoxy group such as methoxy, ethoxy, propoxy, butoxy or the like; nitro group; a halogen group such as chlorine, bromine or the like; cyano group; and a dialkyl amino group such as dimethyl amino, diethyl amino or the like.

Among the groups expressed by X, the hydroxyl group is particularly suitable.

Among the above coupler residues, preferable ones are expressed by the general formulas (III), (VI), (VII), (VIII), (IX) and (X), and X in the above general formulas is preferably the hydroxyl group. Among them, the coupler residue expressed by the general formula (XI),

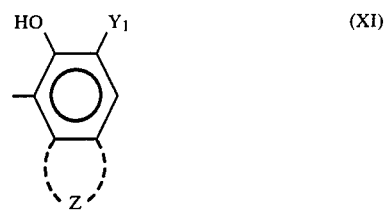

(XI)

(wherein $Y_1$ and Z are the same as mentioned above) is preferable, and the coupler residue expressed by the general formula (XII),

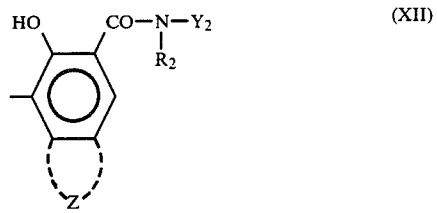

(XII)

(wherein Z, $Y_2$ and $R_2$ are the same as mentioned above) is more preferable.

Still more preferable coupler residues among the above mentioned groups are expressed by the general formula (XIII) and (XIV),

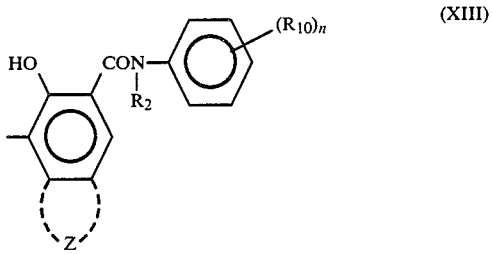

(XIII)

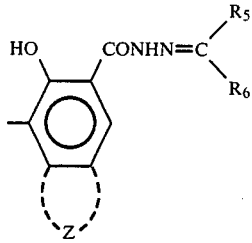
(XIV)
(wherein Z, $R_2$, $R_5$ and $R_6$ are the same as mentioned above, and $R_{10}$ is the same as those illustrated with regard to the substituents for $Y_2$, n being an integer of 0 to 5).
Examples of the coupler residue A include as follows:
| Coupler Residue No. | A |
|---|---|
| 1 | 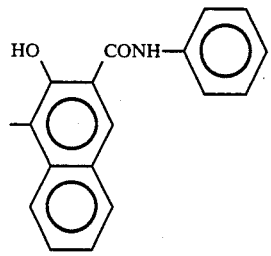 |
| 2 | 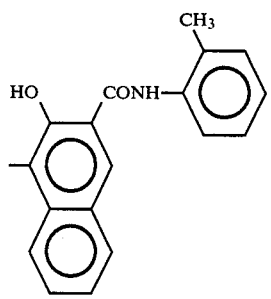 |
| 3 | 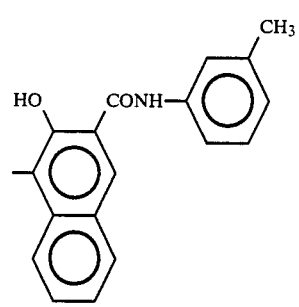 |
| 4 | 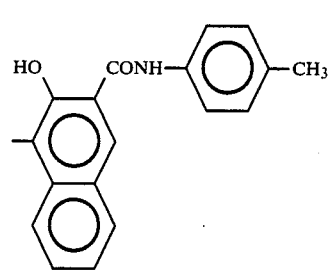 |
| 5 | 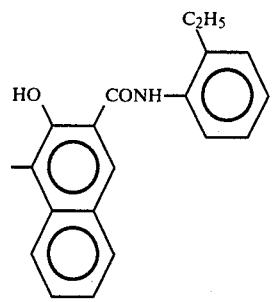 |
| 6 | 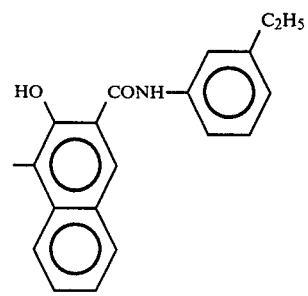 |
| 7 | 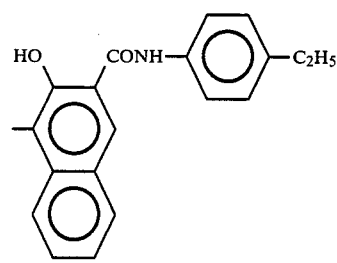 |
| 8 | 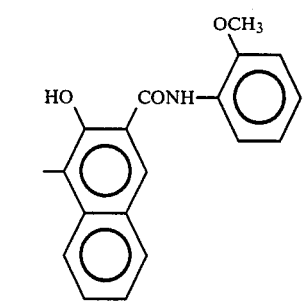 |
| 9 | 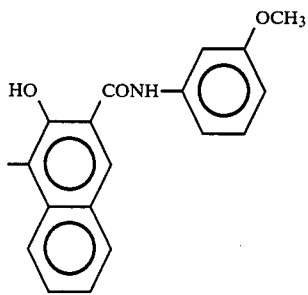 |

-continued
| Coupler Residue No. | A |
|---|---|
| 10 | 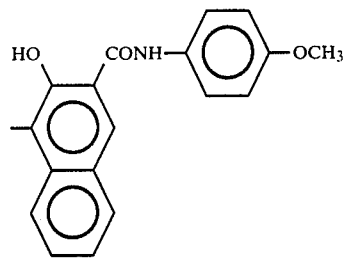 |
| 11 | 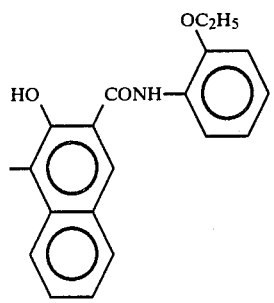 |
| 12 | 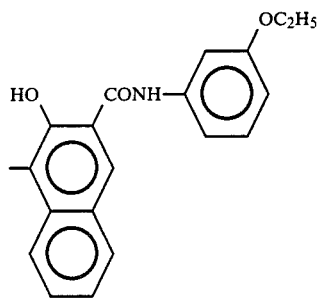 |
| 13 | 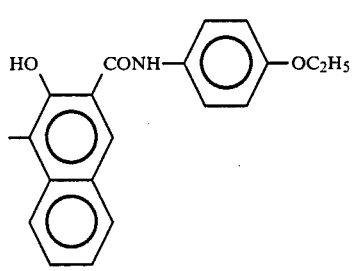 |
| 14 | 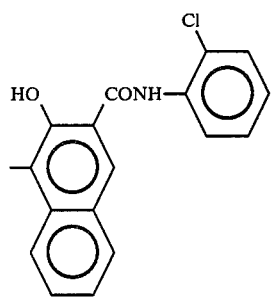 |
-continued
| Coupler Residue No. | A |
|---|---|
| 15 | 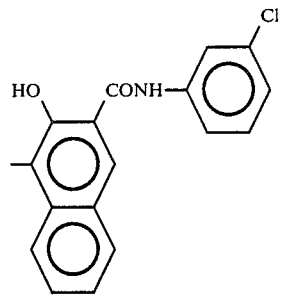 |
| 16 | 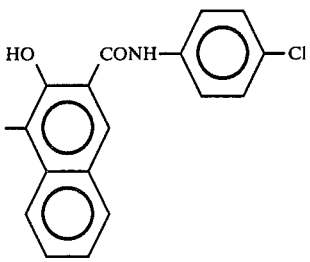 |
| 17 | 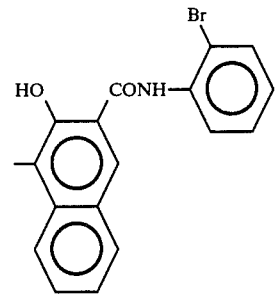 |
| 18 | 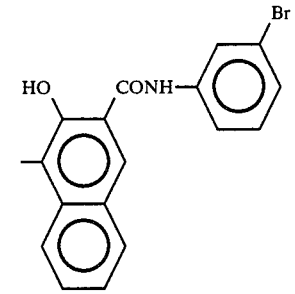 |
| 19 | 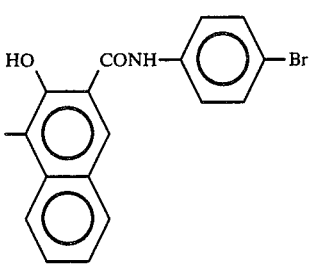 |

-continued
| Coupler Residue No. | A |
|---|---|
| 20 | 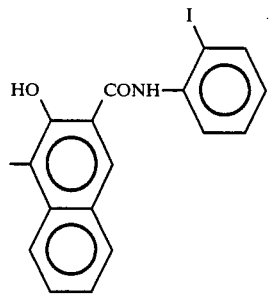 |
| 21 | 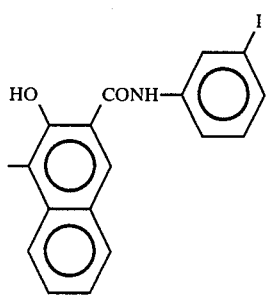 |
| 22 | 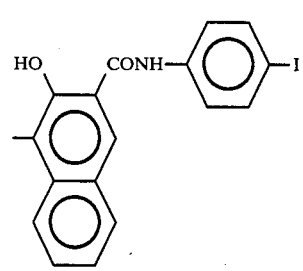 |
| 23 | 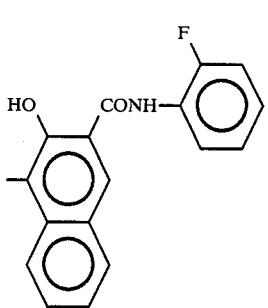 |
| 24 | 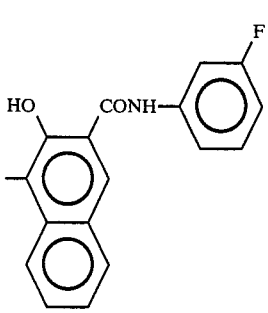 |
-continued
| Coupler Residue No. | A |
|---|---|
| 25 | 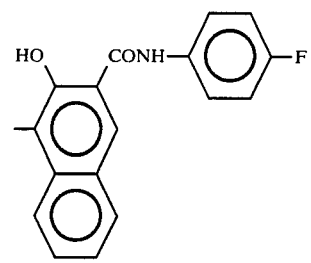 |
| 26 | 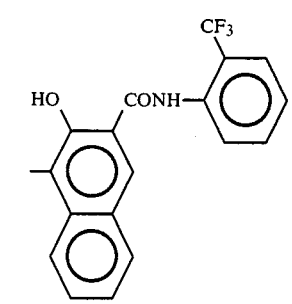 |
| 27 | 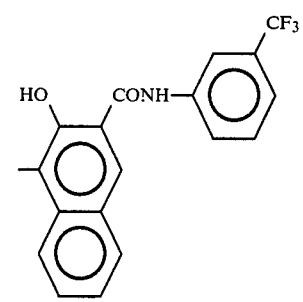 |
| 28 | 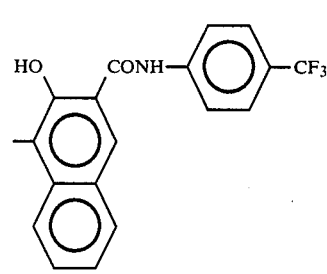 |
| 29 | 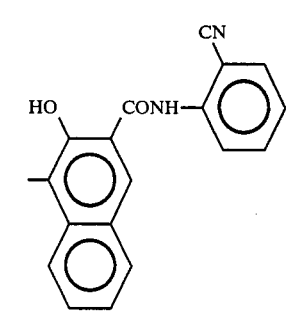 |

| Coupler Residue No. | A |
|---|---|
| 30 | 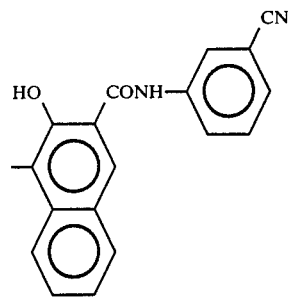 |
| 31 | 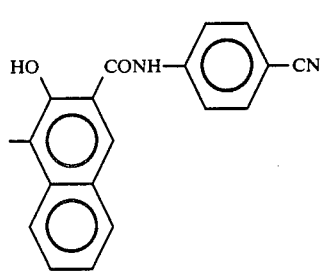 |
| 32 | 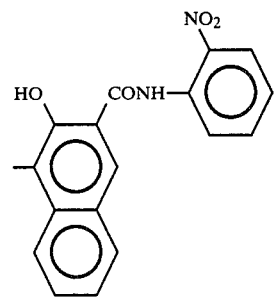 |
| 33 | 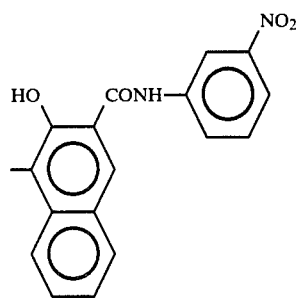 |
| 34 | 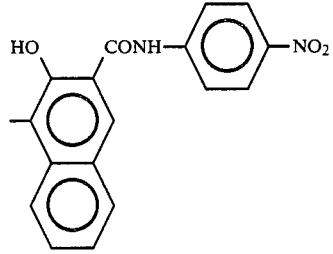 |
| 35 | 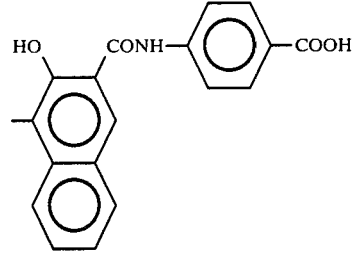 |
| 36 | 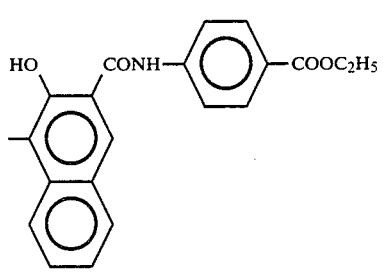 |
| 37 | 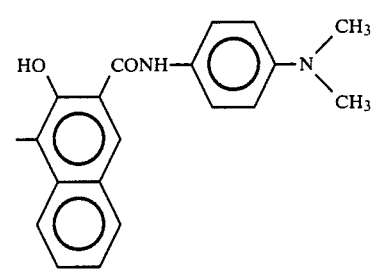 |
| 38 | 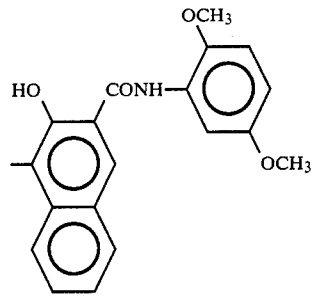 |
| 39 | 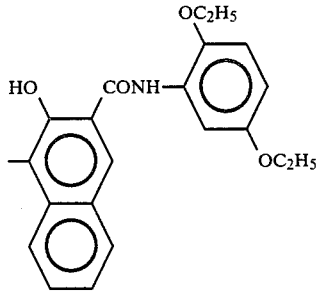 |

| Coupler Residue No. | A |
|---|---|
| 40 | 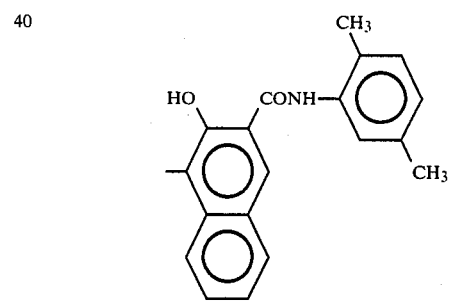 |
| 41 | 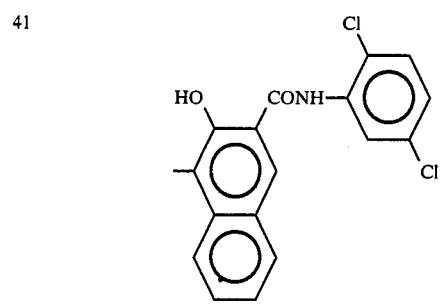 |
| 42 | 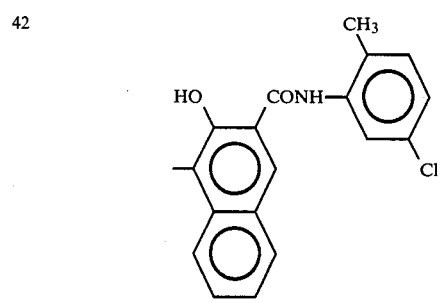 |
| 43 | 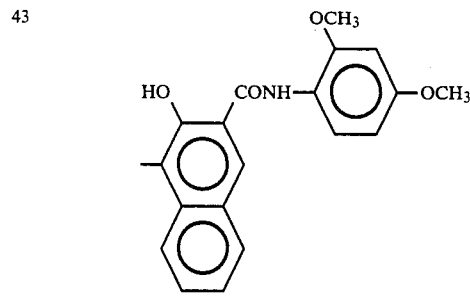 |
| 44 | 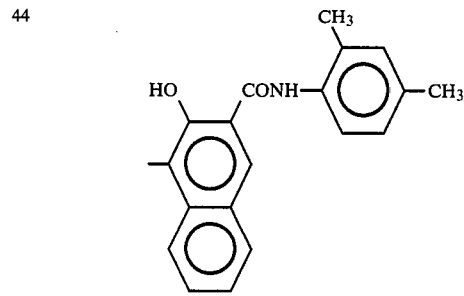 |
| 45 | 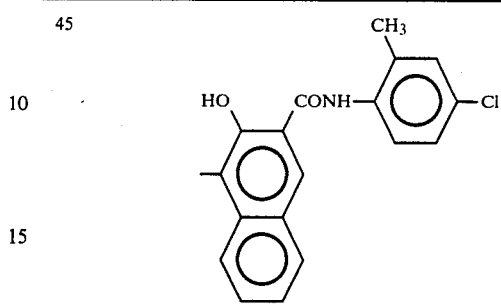 |
| 46 | 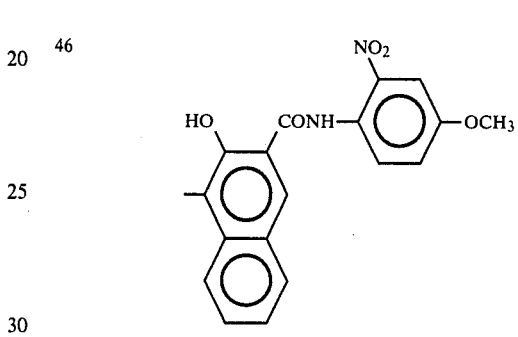 |
| 47 | 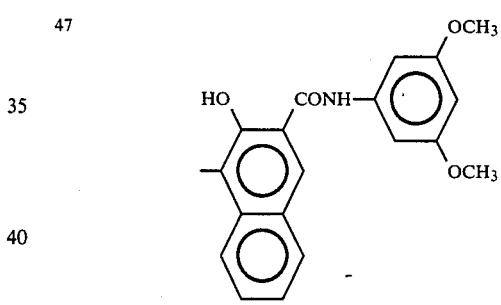 |
| 48 | 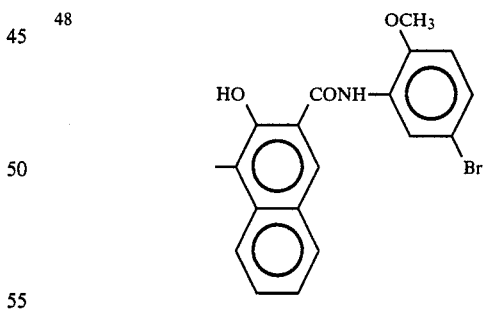 |
| 49 | 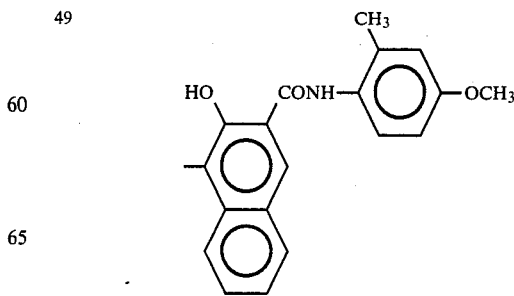 |

-continued
| Coupler Residue No. | A |
|---|---|
| 50 | 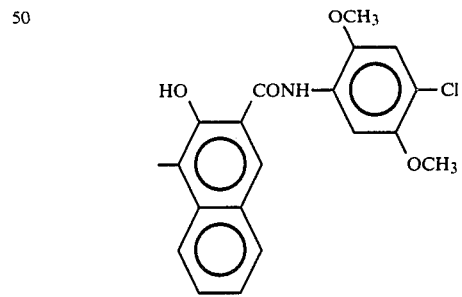 |
| 51 | 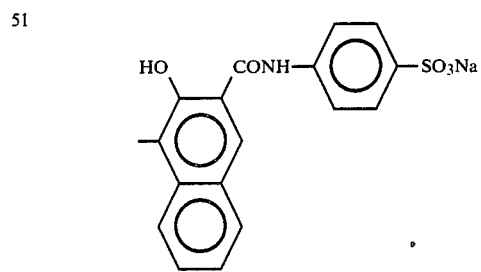 |
| 52 | 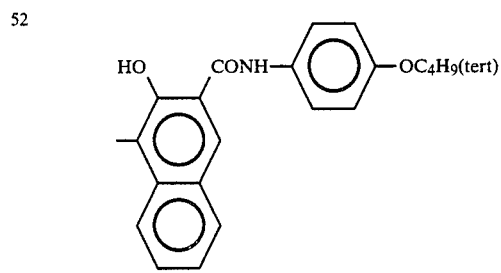 |
| 53 | 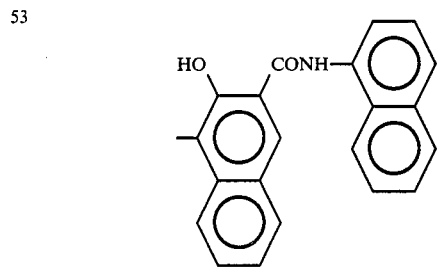 |
| 54 | 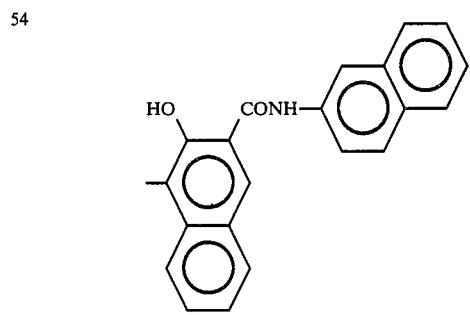 |
-continued
| Coupler Residue No. | A |
|---|---|
| 55 | 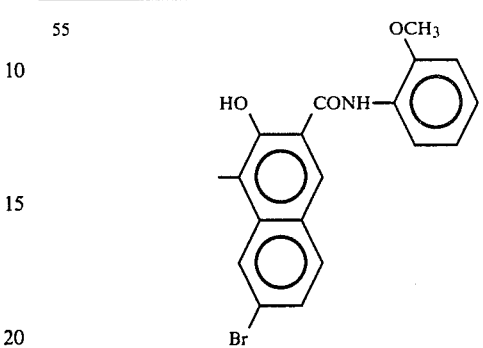 |
| 56 | 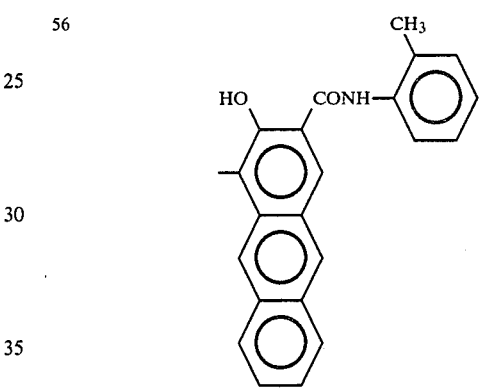 |
| 57 | 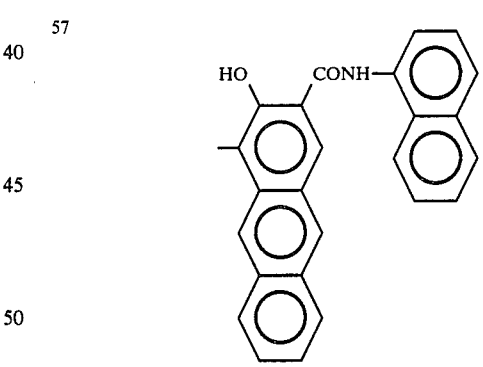 |
| 58 | 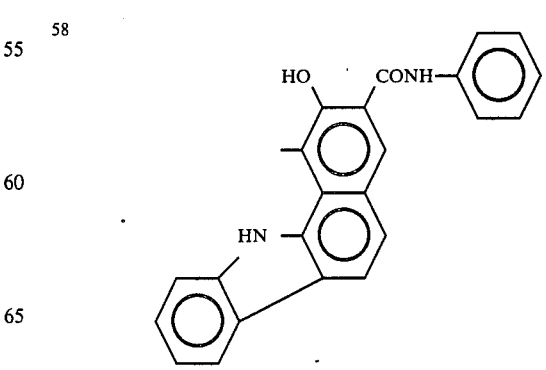 |

-continued
| Coupler Residue No. | A |
|---|---|
| 59 | 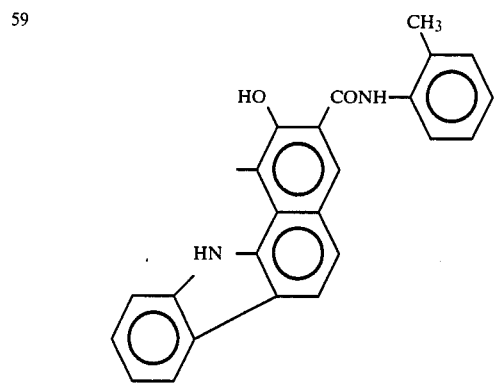 |
| 60 | 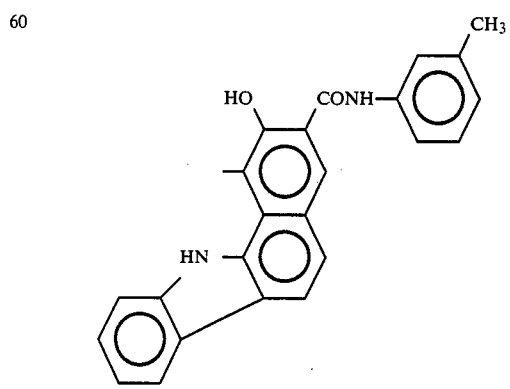 |
| 61 | 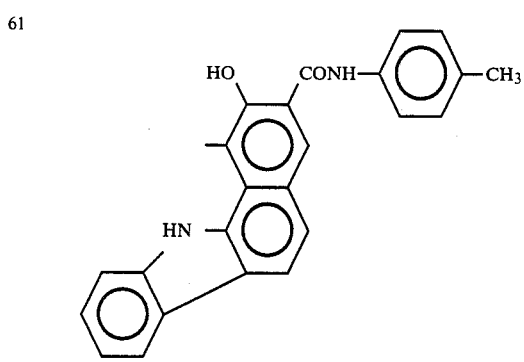 |
| 62 | 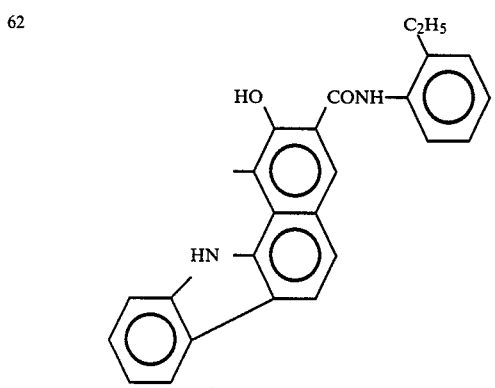 |
| 63 | 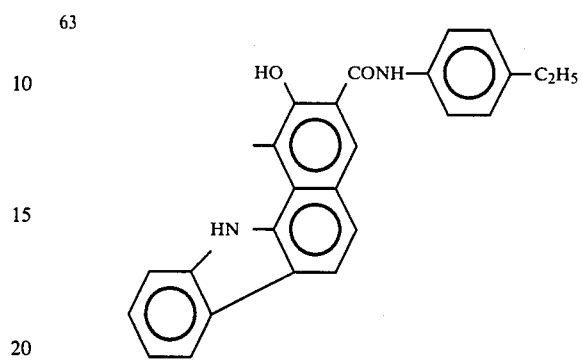 |
| 64 | 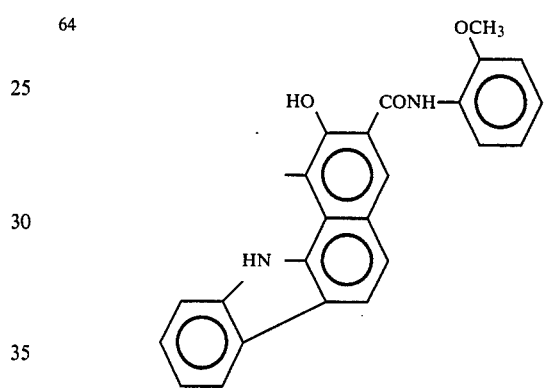 |
| 65 | 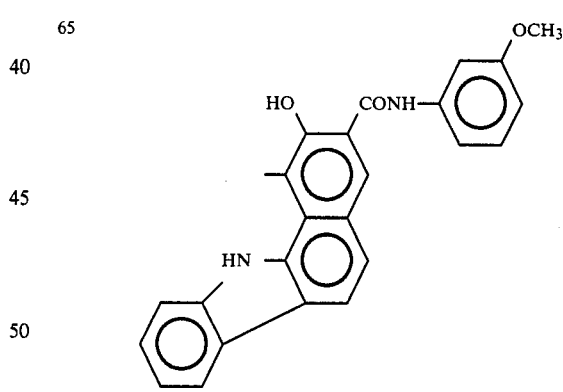 |
| 66 | 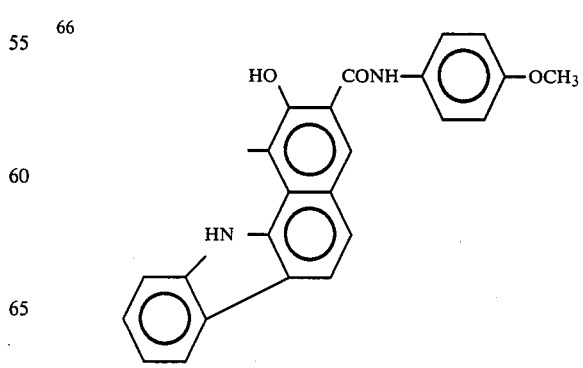 |

| Coupler Residue No. | A |
|---|---|
| 67 | 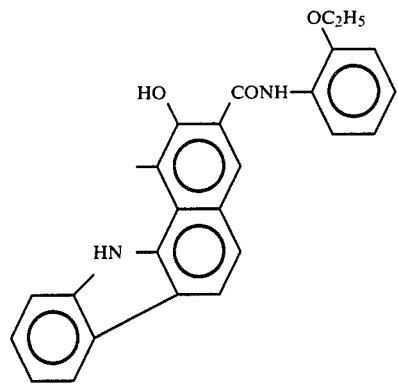 |
| 68 | 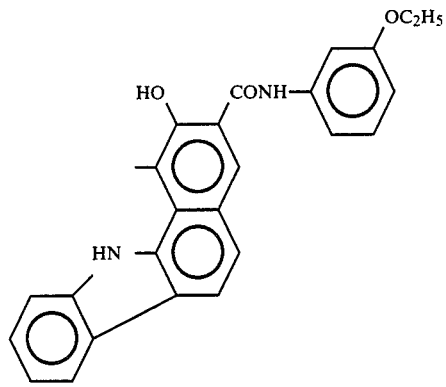 |
| 69 | 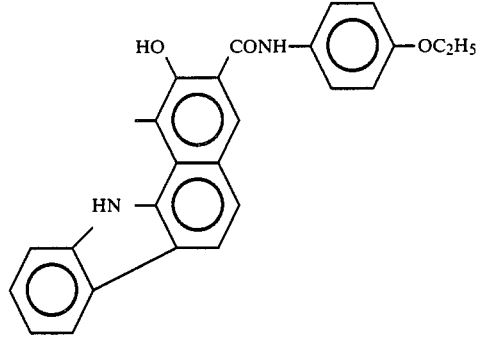 |
| 70 | 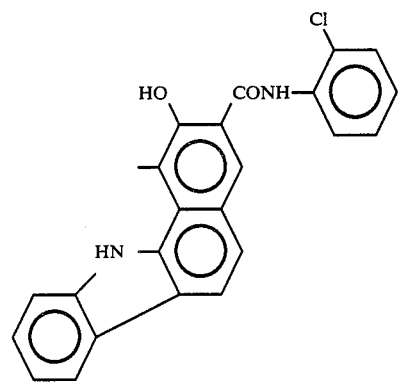 |
| 71 | 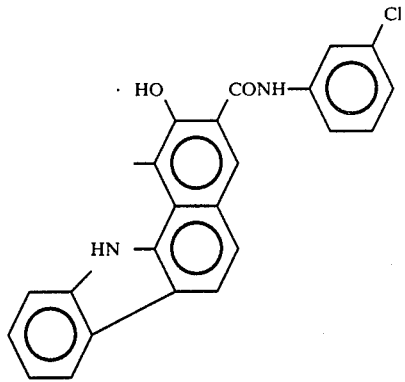 |
| 72 | 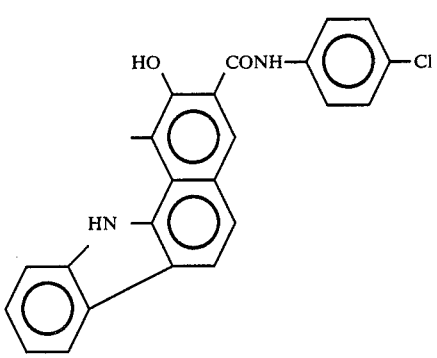 |
| 73 | 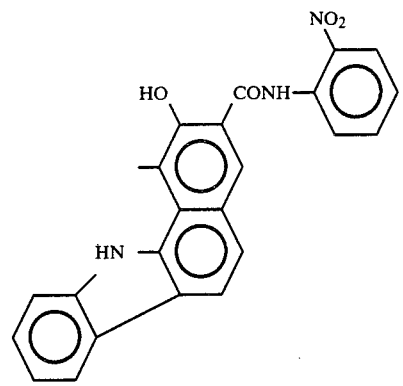 |
| 74 | 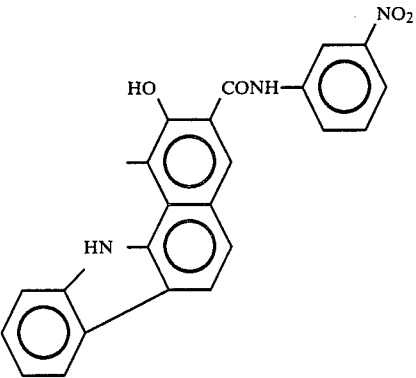 |

| Coupler Residue No. | A |
|---|---|
| 75 | 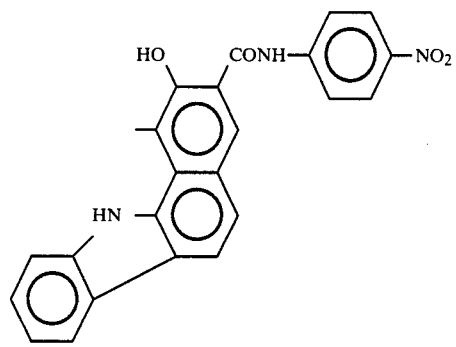 |
| 76 | 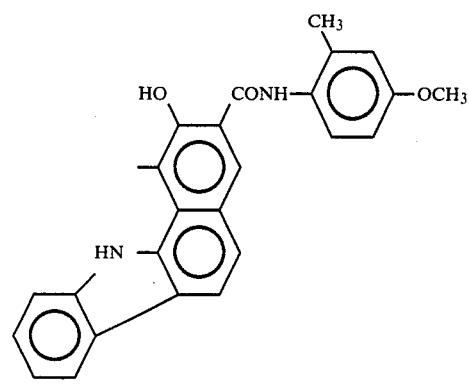 |
| 77 | 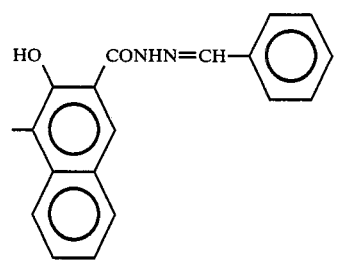 |
| 78 | 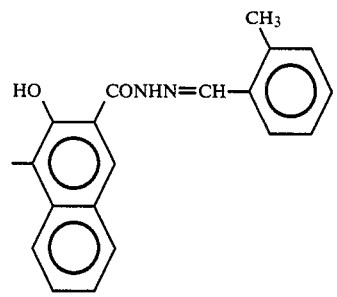 |
| 79 | 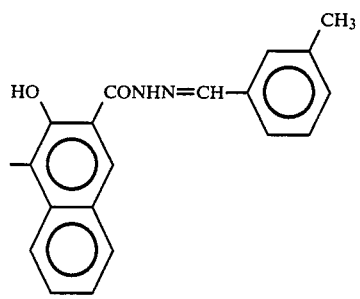 |
| 80 | 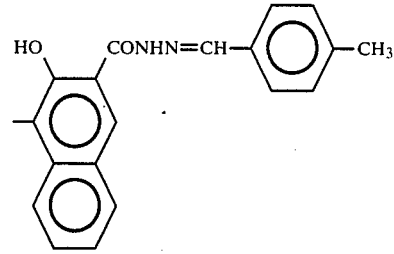 |
| 81 | 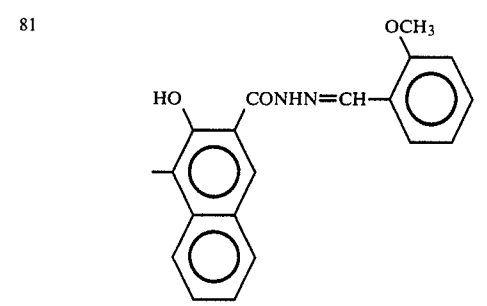 |
| 82 | 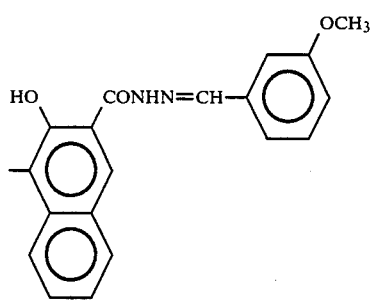 |
| 83 | 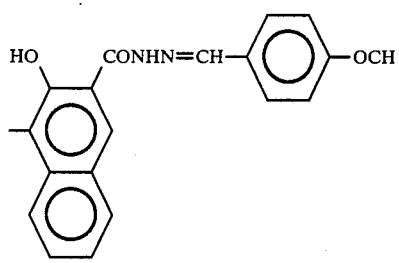 |
| 84 | 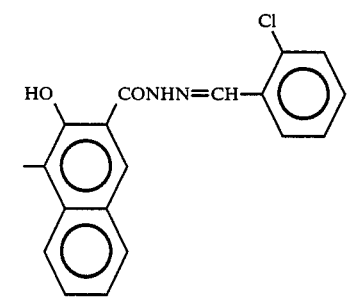 |

-continued
| Coupler Residue No. | A |
|---|---|
| 85 | 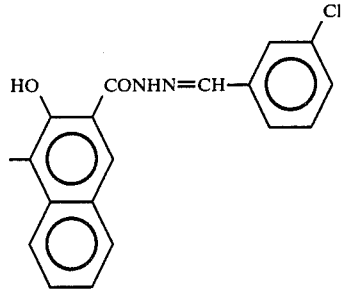 |
| 86 | |
| 87 | |
| 88 | 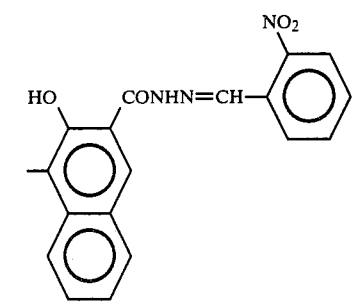 |
| 89 | 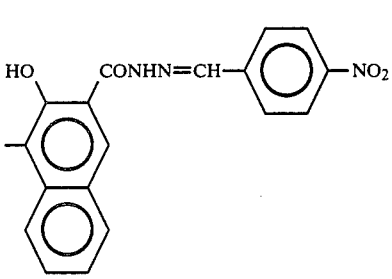 |
-continued
| Coupler Residue No. | A |
|---|---|
| 90 | 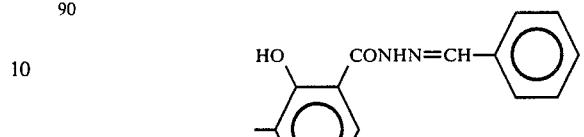 |
| 91 | 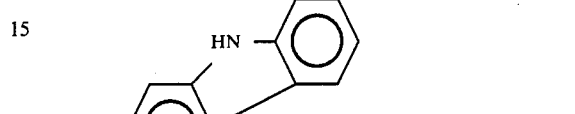 |
| 92 | 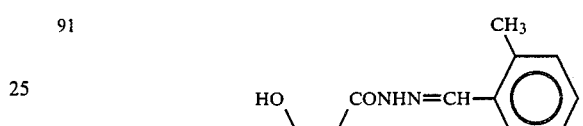 |
| 93 | 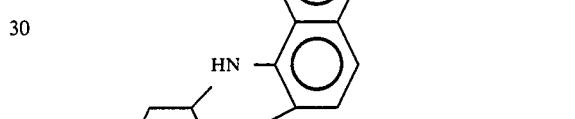 |

| Coupler Residue No. | A |
|---|---|
| 94 | 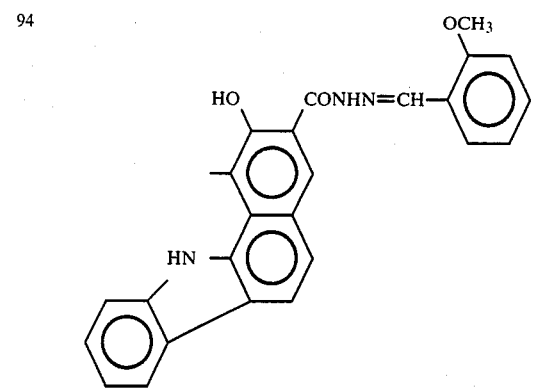 |
| 95 | 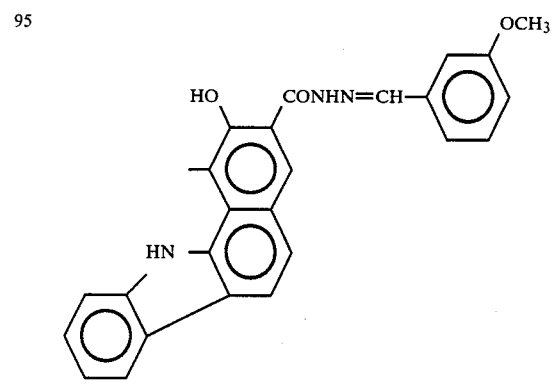 |
| 96 | 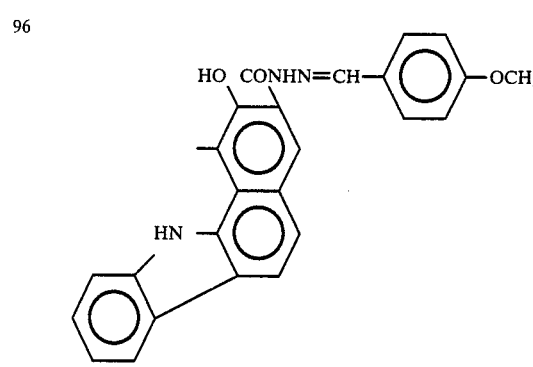 |
| 97 | 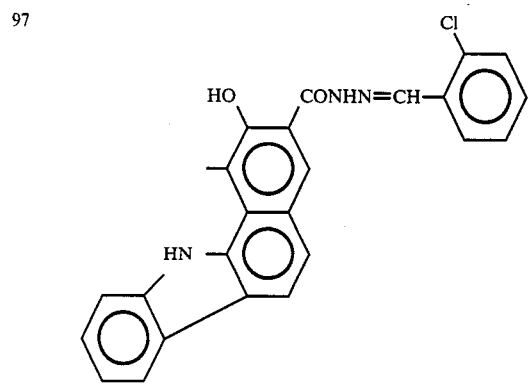 |
| Coupler Residue No. | A |
|---|---|
| 98 | 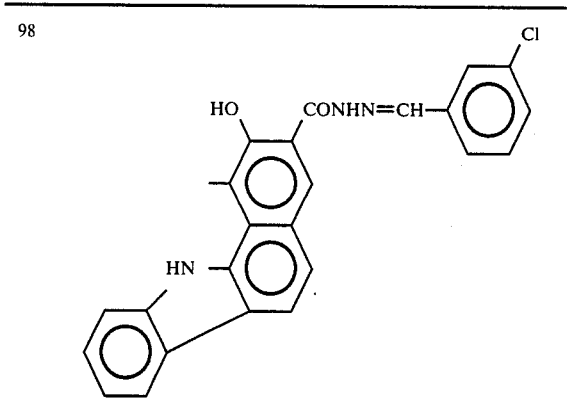 |
| 99 | 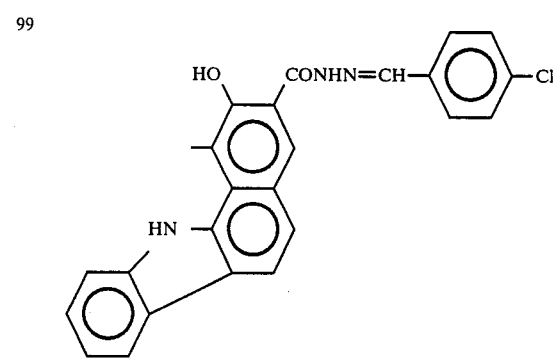 |
| 100 | 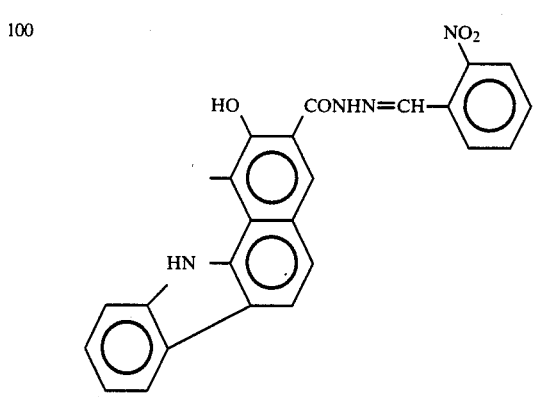 |
| 101 | 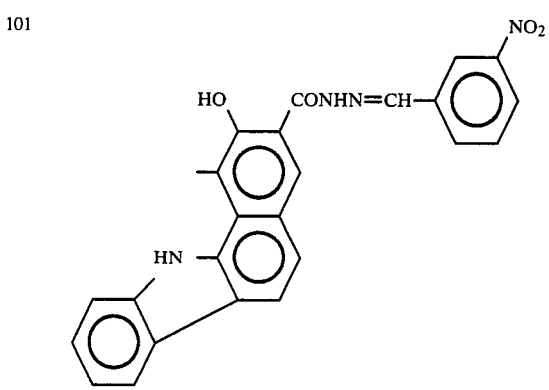 |

| Coupler Residue No. | A |
|---|---|
| 102 | 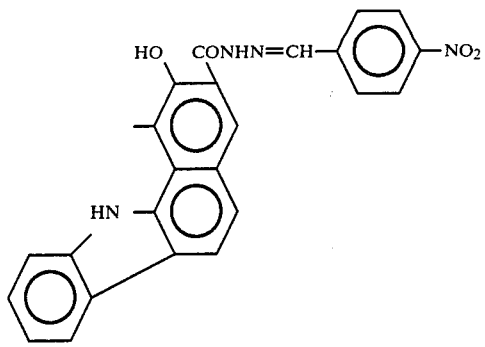 |
| 103 | 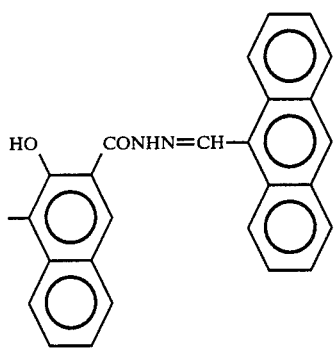 |
| 104 | 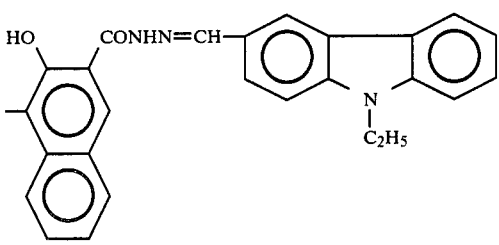 |
| 105 | 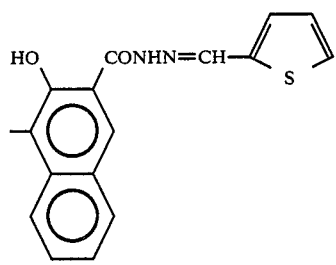 |
| 106 | 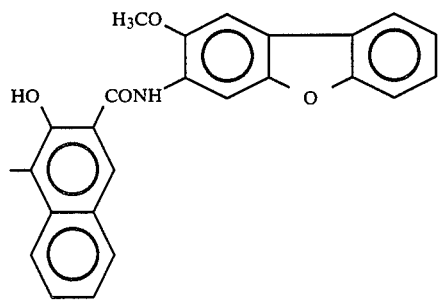 |
| 107 | 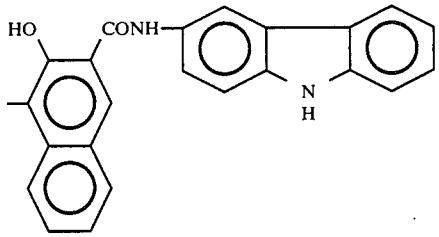 |
| 108 | 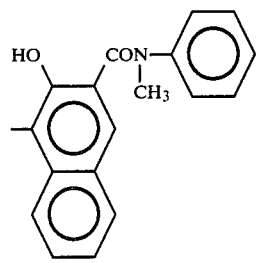 |
| 109 | 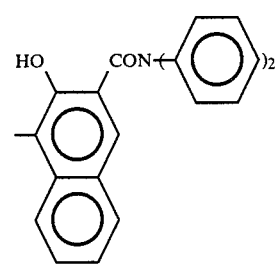 |
| 110 | 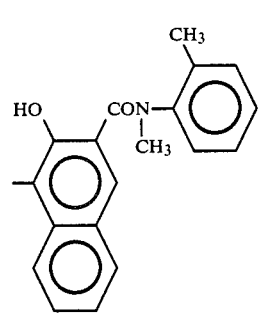 |
| 111 | 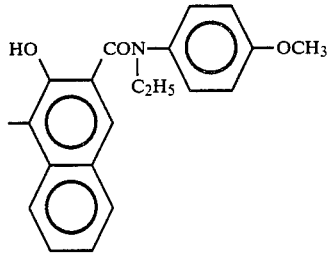 |

| Coupler Residue No. | A |
|---|---|
| 112 | 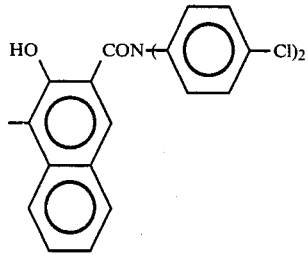 |
| 113 | 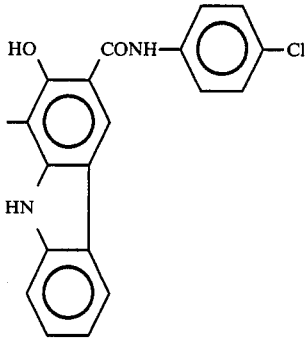 |
| 114 | 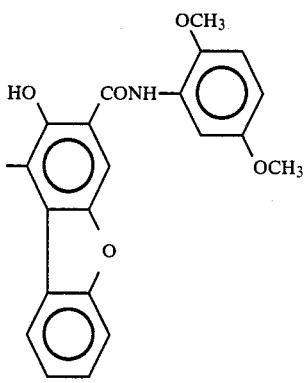 |
| 115 | 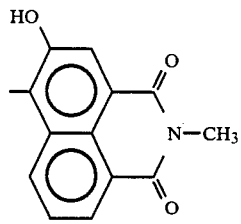 |
| 116 | 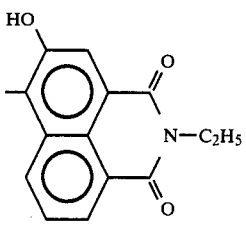 |
| 117 | 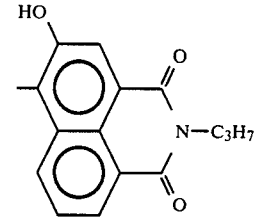 |
| 118 | 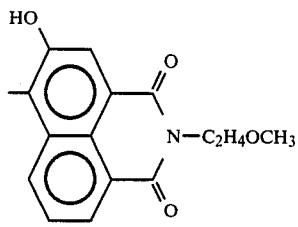 |
| 119 | 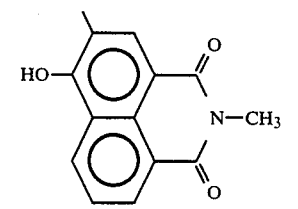 |
| 120 | 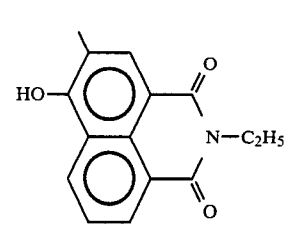 |
| 121 | 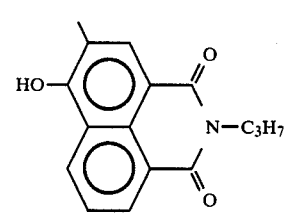 |
| 122 | 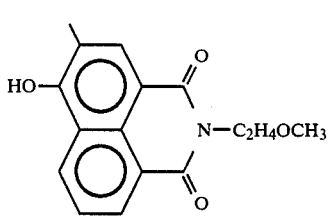 |
| 123 | 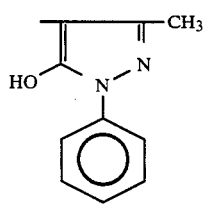 |

-continued
| Coupler Residue No. | A |
|---|---|
| 124 | 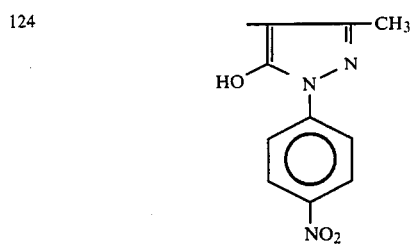 |
| 125 | 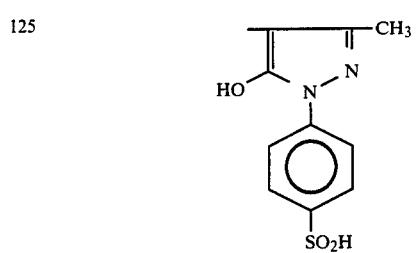 |
| 126 | 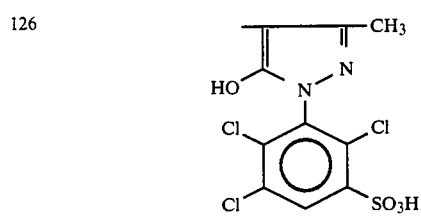 |
| 127 | 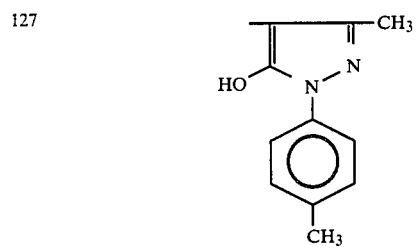 |
| 128 | 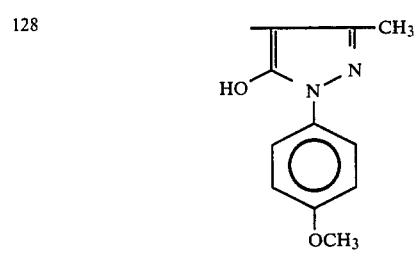 |
| 129 | 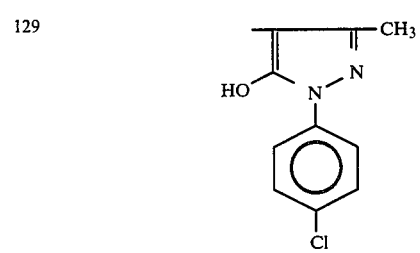 |
-continued
| Coupler Residue No. | A |
|---|---|
| 130 | 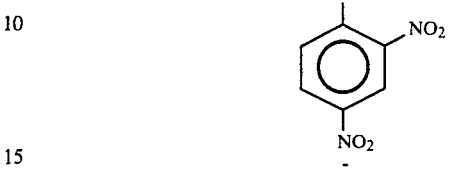 |
| 131 | 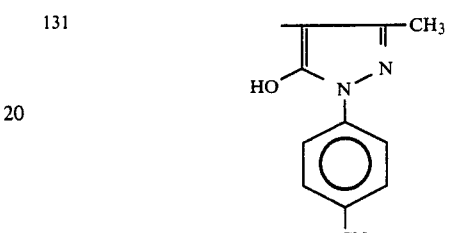 |
| 132 | 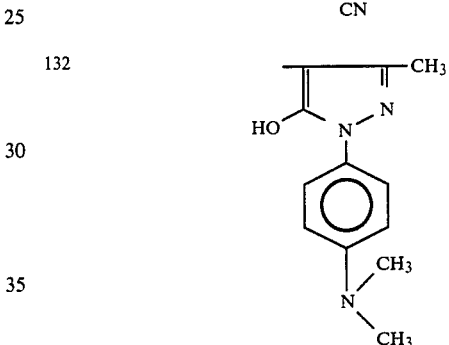 |
| 133 | 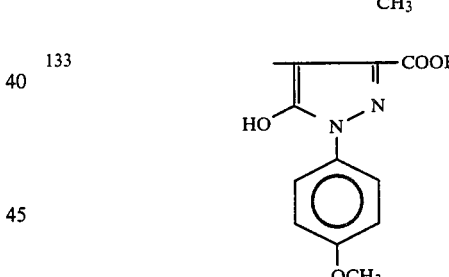 |
| 134 | 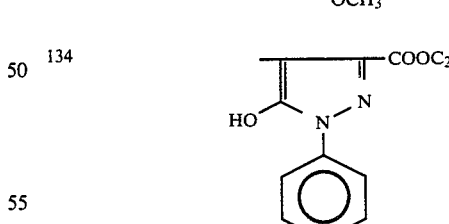 |
| 135 | 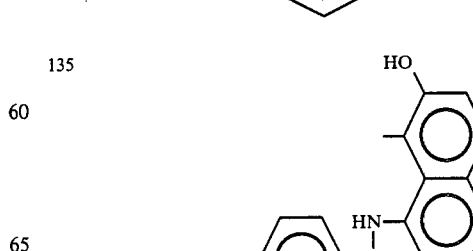 |

-continued
| Coupler Residue No. | A |
|---|---|
| 136 | 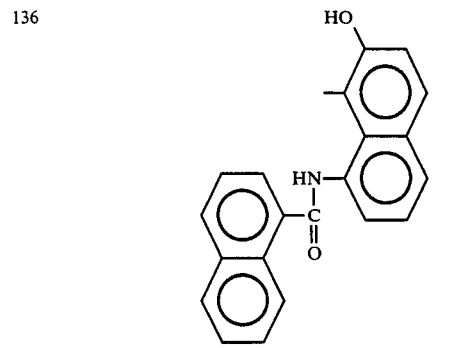 |
| 137 | 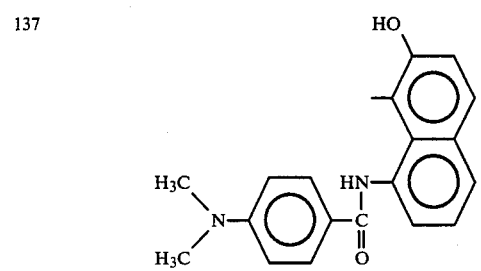 |
| 138 | 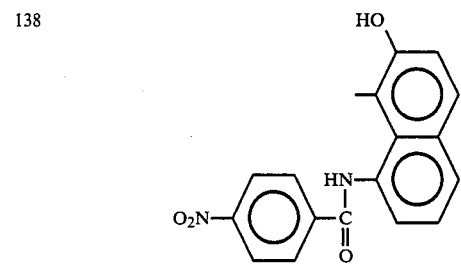 |
| 139 | 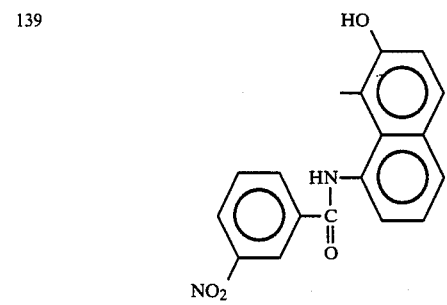 |
| 140 | 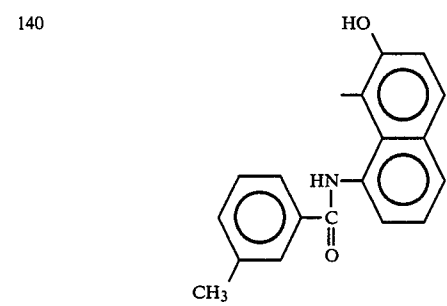 |
-continued
| Coupler Residue No. | A |
|---|---|
| 141 | 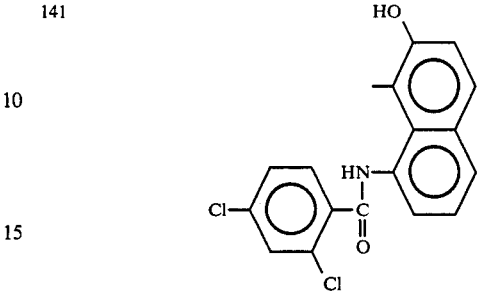 |
| 142 | 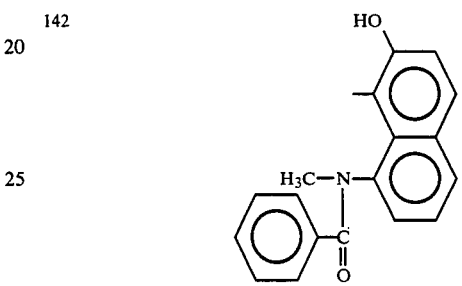 |
| 143 | 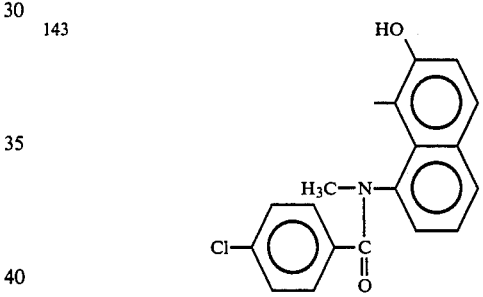 |
| 144 | 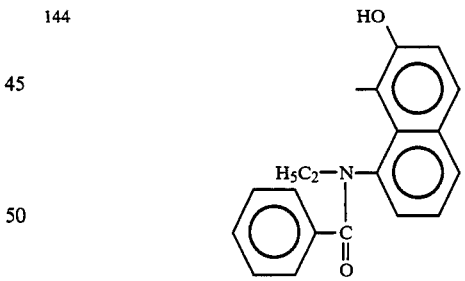 |
| 145 | 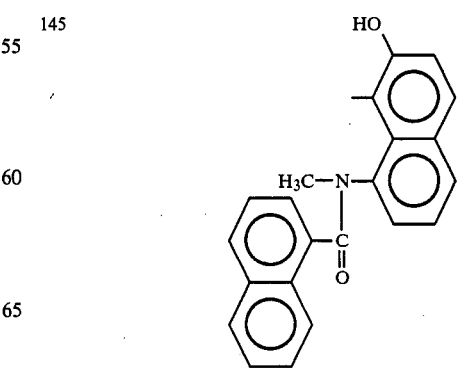 |

-continued

| Coupler Residue No. | A |
|---|---|
| 146 | 2-methyl-3-hydroxy-N-methyl-N-(4-nitrobenzoyl)naphthylamine derivative |
| 147 | 2-methyl-3-hydroxy-N-methyl-N-(3-methylbenzoyl)naphthylamine derivative |
| 148 | 2-methyl-3-hydroxy-N-methyl-N-(2,4-dichlorobenzoyl)naphthylamine derivative |
| 149 | 2-methyl-3-hydroxy-N-benzoylnaphthylamine derivative |
| 150 | 2-methyl-3-hydroxy-N-(4-chlorobenzoyl)naphthylamine derivative |
| 151 | 2-methyl-3-hydroxy-N-ethyl-N-benzoylnaphthylamine derivative |
| 152 | 2-methyl-3-hydroxy-N-(1-naphthoyl)naphthylamine derivative |
| 153 | 2-methyl-3-hydroxy-6-(benzoylamino)naphthalene derivative |
| 154 | 3-methyl-2-benzoylamino-1-hydroxynaphthalene derivative |
| 155 | 2-methyl-3-hydroxy-7-(benzoylamino)naphthalene derivative |
| 156 | 3-methyl-2-benzoylamino-1-hydroxynaphthalene derivative |
| 157 | 3-methyl-2-(3-methylbenzoylamino)-1-hydroxynaphthalene derivative |

(Note: structural formulas as drawn; textual descriptions approximate the depicted structures.)

| Coupler Residue No. | A |
|---|---|
| 158 | 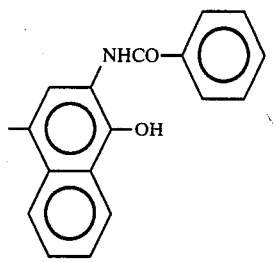 |
| 159 | 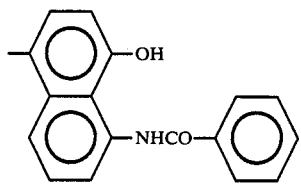 |
| 160 | 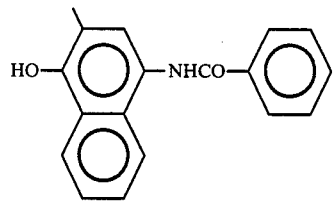 |
| 161 | 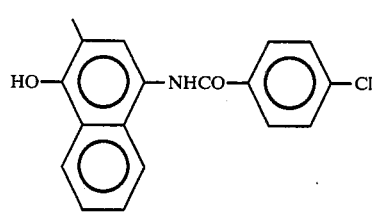 |
| 162 | 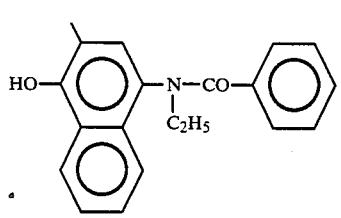 |
| 163 | 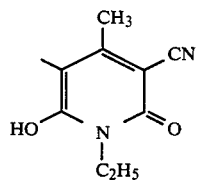 |
| 164 | 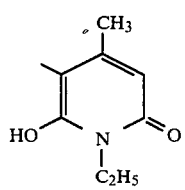 |

| Coupler Residue No. | A |
|---|---|
| 165 | 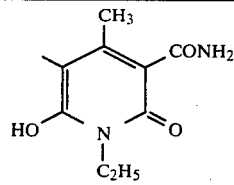 |

Examples of resins in which the azo pigment of the present invention is dispersed include polyester resin, polycarbonate resin, polyamide resin, polyurethane resin, epoxy resin, alkyd resin, phenol resin, melamine resin, acrylic resin, cellulose resin, vinyl acetate resin, vinyl chloride resin, vinylidene chloride resin, vinylidene fluoride resin, butyral resin, polyvinyl carbazol resin, polystyrene resin, polyimide resin, polyacrylonitrile resin, vinyl chloride-vinyl acetate copolymer, vinylidene chloride-acrylonitrile copolymer, styrene-maleic anhydride copolymer, styrene-butadiene copolymer and the like.

Examples of additives used in the present invention include metallic oxides such as zinc oxide, titanium oxide, lead oxide, alumina and the like, and charge transfer materials such as the following charge donor materials and charge acceptor materials listed below.

The charge transfer material includes a positive hole transfer material and an electron transfer material. Examples of the hole transfer material (charge donor material) include compounds as expressed by the following general formulas (a) to (k).

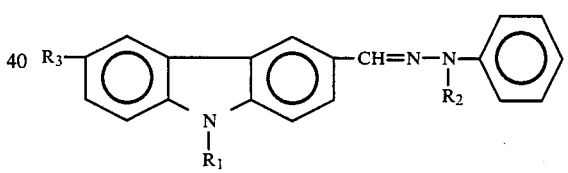

(a)

(wherein $R_1$ represents methyl, ethyl, 2-hydroxyethyl or 2-chloroethyl; $R_2$ represents methyl, ethyl, benzyl or phenyl; and $R_3$ represents hydrogen, chlorine, bromine, an alkyl group having 1 to 4 carbon atoms, an alkoxy group having 1 to 4 carbon atoms, a dialkylamino group or nitro group.)

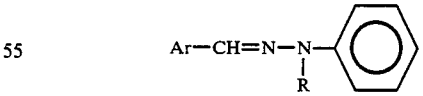

(b)

(wherein Ar represents a naphthalene ring, anthracene ring, styryl and their substituents or a pyridine ring, furan ring, or thiophene ring; and R represents an alkyl or benzyl group.)

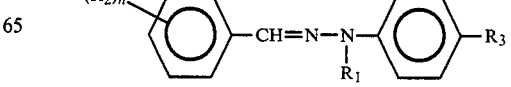

(c)

(wherein $R_1$ represents alkyl, benzyl, phenyl or naphthyl; $R_2$ represents hydrogen, an alkyl group having 1 to 3 carbon atoms, an alkoxy group having 1 to 3 carbon atoms, dialkylamino, diaralkylamino or diarylamino group; n represents an integer of 1 to 4; when n is 2 or more, $R_2$ may be the same or different; and $R_3$ represents hydrogen or methoxy.)

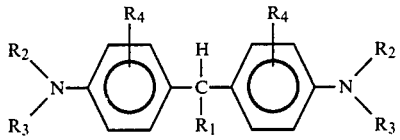
(d)

(wherein $R_1$ represents alkyl having 1 to 11 carbon atoms, substituted or non-substituted phenyl or heterocyclic group; $R_2$ and $R_3$ may be the same or different and represent hydrogen, alkyl having 1 to 4 carbon atoms, hydroxyalkyl, chloroalkyl, substituted or non-substituted aralkyl; $R_2$ and $R_3$ may be bonded with each other to form a heterocyclic ring containing nitrogen; $R_4$ may be the same or different and represents hydrogen, alkyl having 1 to 4 carbon atoms, alkoxy or halogen.)

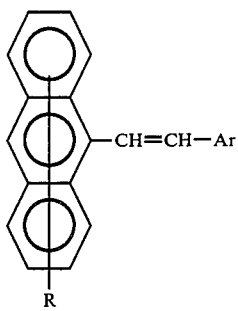
(e)

(wherein R represents hydrogen or a halogen atom; and Ar represents substituted or non-substituted phenyl, naphthyl, anthryl or carbazolyl.)

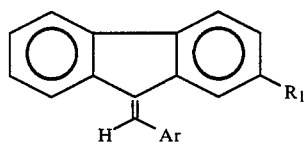
(f)

(wherein $R_1$ represents hydrogen, halogen, cyano, alkoxy having 1 to 4 carbon atoms or alkyl having 1 to 4 carbon atoms; Ar represents

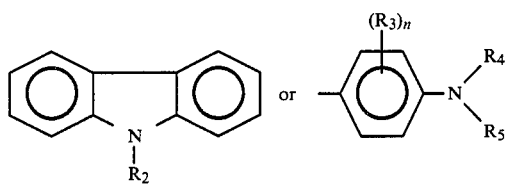

wherein $R_2$ represents an alkyl group having 1 to 4 carbon atoms, $R_3$ represents hydrogen, halogen, an alkyl group having 1 to 4 carbon atoms, an alkoxy group having 1 to 4 carbon atoms or a dialkyl amino group, n is an integer of 1 or 2; when n is 2, $R_3$ may be the same or different; $R_4$ and $R_5$ represent hydrogen, a substituted or non-substituted alkyl group having 1 to 4 carbon atoms or substituted or non-substituted benzyl group.)

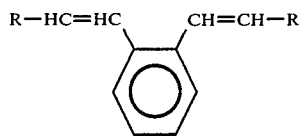
(g)

(wherein R represent carbazolyl, pyridyl, thienyl, indolyl, furyl, or substituted or non-substituted phenyl, styryl, naphthyl or anthryl group; these substituents are selected from the group of dialkylamino, alkyl, alkoxy, carboxyl or its ester, halogen atom, cyano, aralkylamino, N-alkyl-N-aralkylamino, amino, nitro and acetyl amino groups.)

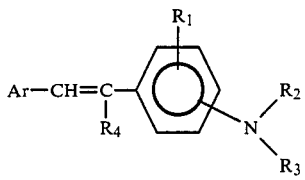
(h)

(wherein $R_1$ represents a lower alkyl or benzyl group; $R_2$ represents hydrogen, a lower alkyl, lower alkoxy, halogen, nitro, amino, or amino group substituted with a lower alkyl or benzyl group; and n is an integer of 1 or 2.)

(i)

(wherein $R_1$ represents hydrogen, alkyl, alkoxy or halogen; $R_2$ and $R_3$ represent an alkyl, substituted or non-substituted aralkyl, or substituted or non-substituted aryl group; $R_4$ represents hydrogen or substituted or non-substituted phenyl; and Ar represents phenyl or naphthyl group.)

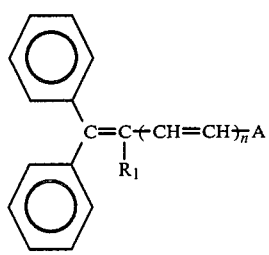
(j)

(wherein n is an integer of 0 or 1; $R_1$ represents hydrogen, alkyl or substituted or non-substituted phenyl; A represents

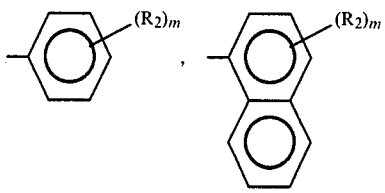

9-anthryl, or substituted or non-substituted N-alkylcarbazolyl group, wherein $R_2$ represents hydrogen, alkyl, alkoxy, halogen or

wherein $R_3$ and $R_4$ represent alkyl, substituted or non-substituted aralkyl, or substituted or non-substituted aryl group, and $R_3$ and $R_4$ may form a ring; and m is an integer of 0, 1, 2 or 3, when m is 2 or more, $R_2$ may be the same or different.)

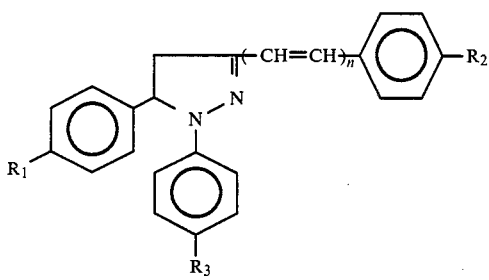

(k)

(wherein $R_1$, $R_2$ and $R_3$ are hydrogen, lower alkyl, lower alkoxy, dialkylamino, or halogen; and n is 0 or 1.)

Examples of the compound expressed by the general formula (a) include: 9-ethylcarbazole-3-aldehyde-1-methyl-1-phenylhydrazone, 9-ethylcarbazole-3-aldehyde-1-benzyl-1-phenylhydrazone, 9-ethylcarbazole-3-aldehyde 1,1-diphenylhydrazone, and the like.

Examples of the compound expressed by the general formula (b) include: 4-diethylaminostyrene-β-aldehyde-1-methyl-1-phenylhydrazone, 4-methoxynaphthalene-1-aldehyde-1-benzyl-1-phenylhydrazone, and the like.

Examples of the compound expressed by the general formula (c) include: 4-methoxybenzaldehyde 1-methyl-1-phenylhydrazone, 2,4-dimethoxybenzaldehyde 1-benzyl-1-phenylhydrazone, 4-diethylaminobenzaldehyde 1,1-diphenylhydrazone, 4-methoxybenzaldehyde 1-benzyl-1-(4-methoxy)phenyl hydrazone, 4-diphenylaminobenzaldehyde-1-benzyl-1-phenylhydrazone, 4-dibenzylaminobenzaldehyde 1,1-diphenylhydrazone and the like.

Examples of the compound expressed by the general formula (d) include: 1,1-bis(4-dibenzylaminophenyl)propane, tris(4-diethylaminophenyl)methane, 1,1-bis(4-dibenzylaminophenyl)propane, 2,2'-dimethyl-4,4'-bis(diethylamino)-triphenylmethane and the like.

Examples of the compound expressed by the general formula (e) include: 9-(4-diethylaminostyryl)anthracene, 9-bromo-10-(4-diethylaminostyryl)anthracene, and the like.

Examples of the compound expressed by the general formula (f) include: 9-(4-dimethylaminobenzylidene)fluorene, 3-(9-fluorenylidene)-9-ethylcarbazole, and the like.

Examples of the compound expressed by the general formula (g) include: 1,2-bis(4-diethylaminostyryl)benzene, 1,2-bis(2,4-dimethoxystyryl)benzene and the like.

Examples of the compound expressed by the general formula (h) include: 3-styryl-9-ethylcarbazole, 3-(4-methoxystyryl)-9-ethylcarbazole, and the like.

Examples of the compound expressed by the general formula (i) include: 4-diphenylaminostilbene, 4-dibenzylaminostilbene, 4-ditolylaminostilbene, 1-(4-diphenylaminostyryl)naphthalene, 1-(4-diethylaminostyryl)naphthalene, and the like.

Examples of the compound expressed by the general formula (j) include: 4'-diphenylamino-alpha-phenylstilbene, 4'-methylphenylamino-alpha-phenylstilbene, and the like.

Examples of the compound expressed by the general formula (k) include: 1-phenyl-3-(4-diethylaminostyryl)-5-(4-diethylaminophenyl)pyrazoline, 1-phenyl-3-(4-dimethylaminostyryl)-5-(4-dimethylaminophenyl)-pyrazoline, and the like.

Other examples of a positive hole transfer material (charge donor material) include: oxadiazole compounds such as 2,5-bis(4-diethylaminophenyl)-1,3,4-oxadiazole, 2,5-bis(4-(4-diethylaminostyryl)phenyl-1,3,4-oxadiazole, 2-(9-ethylcarbazolyl-3)-5-(4-diethylaminophenyl)-1,3,4-oxadiazole, and the like; low molecular oxazole compounds such as 2-vinyl-4-(2-chlorophenyl)-5-(4-diethylaminophenyl)-oxazole, 2-(4-diethylaminophenyl)-4-phenyloxazole, and the like; and high molecular compounds such as poly-N-vinyl carbazole, halogenated poly-N-vinyl carbazole, polyvinyl pyrene, polyvinyl anthracene, pyrene formaldehyde resin, ethylcarbazole formaldehyde resin, and the like.

Examples of an electron transfer material (charge acceptor material) include: chloroanil, bromoanil, tetracyanoethylene, tetracyanoquinonedimethane, 2,4,7-trinitro-9-fluorenone, 2,4,5,7-tetranitro-9-fluorenone, 2,4,5,7-tetranitroxanthone, 2,4,8-trinitro-thioxanthone, 2,6,8-trinitro-4H-indeno(1,2-b)-thiophene-4-one, 1,3,7-trinitrodibenzothiophene-5,5-dioxide, and the like.

These charge transfer materials are used alone or in the form of a mixture of two or more.

The photoelectric transducer element of the present invention is more fully illustrated by FIGS. 1a, 1b, 2a, 2b, 3a, and 3b. FIGS. 1b, 2b and 3b show structure examples additionally having the second photo-active layer in order to compensate the first photo-active layer shown in FIGS. 1a, 2a and 3a.

In the drawings, 1 represents a light-transmitting front electrode; 2 represents a photo-active layer; 3 represents a photo-active layer different from the photo-active layer 2; 4 represents a back electrode; 5 represents a support for the front electrode; and 6 represents a support for the back electrode. It should be understood that these structures may be variously modified depending on their uses.

The present invention is further illustrated more concretely by the following Examples, but should not be limited thereto.

EXAMPLE 1

1.8 g of the azo pigment of the general formula (I) having the above listed coupler residue No. 44 was ball-milled for a whole day and night with 18 g of 5% tetrahydrofuran solution of butyral resin "S-lec BX-1"

(manufactured by Sekisui Kagaku) and 7.2 g of tetrahydrofuran to prepare a uniform slurry.

The resultant solution was further diluted with tetrahydrofuran by 8 times, and the solution thus obtained was coated on an Al-vapor-deposited Mylar base (film thickness = 100 μm), having a transmittance of 14% at 560 nm wavelength light, by a doctor blade with a wet gap of 50 μm. After being naturally dried, the coated material was dried at 50° C. for 1 hour in the presence of heat. Gold was then vapor-deposited on this coated film to a thickness of about 200 Å through a mask having a circular hole of a diameter of 5 mm and an inlet of a lead wire. A lead wire was then attached to the gold and Al surfaces by an electrically conductive paste, thus producing a photoelectric transducer element of the present invention.

The photoelectric transducer element was then placed in a shielded box which was electrically grounded. Electric current-voltage properties were then measured by applying a varying voltage at a scanning speed of 6.0 mV/sec between the Al and gold electrodes and also by irradiating the element from the Al side with a monochromatic light (incident light amount = 0.043 mW/cm$^2$) of a 500 W Xe lamp, which is spectrally separated into 560 nm wavelength component by a monochromator "P-250 Type" (manufactured by Nihon Kohgaku). In this case, the intensity (Pin') of light transmitted through the Al layer was 6 μW/cm$^2$. The measurement results were as follows:

Voc = 0.62 V, Jsc = 0.030 μA/cm$^2$, ff = 0.25

The conversion efficiency (η') (a value corrected by taking the light-transmittance of the Al-vapor-deposited Mylar base into consideration) of the photoelectric transducer element was 0.08%.

The dark current was then measured by applying a voltage of −0.1 V on the gold surface of the element, and the measured voltage was 29 pA/cm$^2$. The light irradiation was effected on this element in the same manner as above, and an electric current of 0.038 μA/cm$^2$ was generated. Thus, the ratio of photoelectric current/dark current was 1.3 × 10$^3$.

EXAMPLE 2

A pigment film was prepared by dipping a glass substrate having a tin oxide film doped with indium (hereinafter referred to as an ITO substrate) in a pigment dispersion containing the same pigment as in Example 1 prepared in the same manner as in Example 1 and by lifting up the ITO substrate at a speed of 5 mm/sec. Aluminum was then vapor-deposited on the pigment-coated ITO substrate in such a manner as to make the light-transmittance at 560 mm wavelength light about 8%, and the two electrodes were connected with a lead wire in the same manner as in Example 1, thus producing a photoelectric transducer element.

Electric current-voltage properties were measured in the same manner as in Example 1 by irradiating the element with a monochromatic light of 560 nm wavelength (Pin' = 1.6 μW/cm$^2$).
The measurement results were as follows:

Voc = 0.92 V, Jsc = 121 nA/cm$^2$, ff = 0.22 η' = 1.5%
at 560 nm wavelength light.

EXAMPLE 3

A photoelectric transducer element was prepared and electric current-voltage properties were measured in the same manner as in Example 1, except that the azo pigment of the general formula (I) having the above listed coupler residue No. 40 was used.
The measurement results were as follows:

Voc = 0.78 V, Jsc = 12 nA/cm$^2$, ff = 0.26 η' = 0.04%
at 560 nm light (Pin' = 6 μW/cm$^2$).

EXAMPLE 4

A photoelectric transducer element was prepared and electric current-voltage properties were measured in the same manner as in Example 1, except that the azo pigment of the general formula (I) having the above listed coupler residue No. 45 was used.
The measurement results were as follows:

Voc = 0.79 V, Jsc = 30 nA/cm$^2$, ff = 0.19 η' = 0.08%
at 560 nm light (Pin' = 6 μW/cm$^2$).

EXAMPLE 5

A photoelectric transducer element was prepared and electric current-voltage properties were measured in the same manner as in Example 1, except that the azo pigment of the general formula (I) having the above listed coupler residue No. 38 was used.
The measurement results were as follows:

Voc = 0.75 V, Jsc = 13 nA/cm$^2$, ff = 0.23 η' = 0.04%
at 560 nm light (Pin' = 6 μW/cm$^2$)

EXAMPLE 6

A photoelectric transducer element was prepared and electric current-voltage properties were measured in the same manner as in Example 1, except that the azo pigment of the general formula (I) having the above listed coupler residue No. 37 was used.
The measurement results were as follows:

Voc = 0.64 V, Jsc = 4 nA/cm$^2$, ff = 0.23 η' = 0.01% at 620 nm light (Pin' = 5.2 μW/cm$^2$).

EXAMPLE 7

A photoelectric transducer element was prepared and electric current-voltage properties were measured in the same manner as in Example 1, except that the azo pigment of the general formula (I) having the above listed coupler residue No. 16 was used.
The measurement results were as follows:

Voc = 0.68 V, Jsc = 9.6 nA/cm$^2$, ff = 0.15 η' = 0.02%
at 560 nm light (Pin' = 6 μW/cm$^2$).

As mentioned above, the photo-active layer of the photoelectric transducer element of the present invention can be easily prepared simply by coating a dispersion containing an azo pigment. Therefore, a photoelectric transducer element having a large area can be prepared at a low cost in accordance with the present invention. The photoelectric transducer element thus prepared in accordance with the present invention has a high conversion efficiency, and is suitable for the solar light spectrum.

What we claim is:

1. A photoelectric transducer element comprising a light-transmissive front electrode, a photo-active layer, and a back electrode, characterized in that said photo-active layer contains an azo pigment expressed by the general formula (I), $$A-N=N-\underset{}{\bigcirc}-CH=CH-\underset{}{\bigcirc}- \qquad (I)$$

-continued

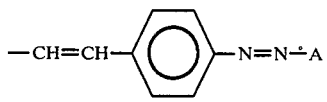

wherein A represents a coupler residue.

2. A photoelectric transducer element as claimed in claim 1, wherein said coupler residue A of the general formula (I) has the following general formula (II), (III), (IV), (V), (VI), (VII), (VIII), (IX), or (X):

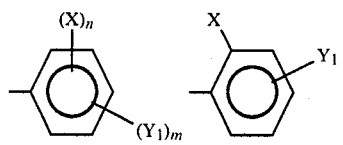

(II)

(III)

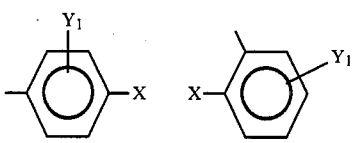

(IV)    (V)

wherein X, $Y_1$, Z, m and n in the above formula (II), (III), (IV) and (V) represent the following groups:

wherein $R_1$ and $R_2$ represent hydrogen or a substituted or non-substituted alkyl group, and $R_3$ represents a substituted or non-substituted alkyl or a substituted or non-substituted aryl group;

$Y_1$: hydrogen, halogen, substituted or non-substituted alkyl group, substituted or non-substituted alkoxy group, carboxyl group, sulfo group, substituted or non-substituted sulfamoyl group or

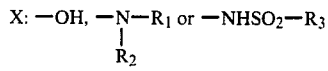

wherein $R_4$ represents hydrogen, alkyl group, substituted alkyl group, phenyl group or substituted phenyl group, and $Y_2$ represents cyclic hydrocarbon group, substituted cyclic hydrocarbon group, heterocyclic group substituted heterocyclic group, or

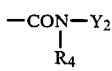

wherein $R_5$ represents a cyclic hydrocarbon group, substituted cyclic hydrocarbon group, heterocyclic group, substituted heterocyclic group, styryl group or substituted styryl group, and $R_6$ represents hydrogen, alkyl group, substituted alkyl group, phenyl group, substituted phenyl group, or $R_5$ and $R_6$ form a ring with the carbon atom bonded thereto;

Z: cyclic hydrocarbon group, substituted cyclic hydrocarbon group, heterocyclic group or substituted heterocyclic group;

n: an integer of 1 or 2; and m: an integer of 1 or 2;

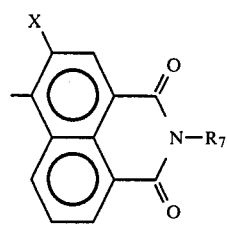

(VI)

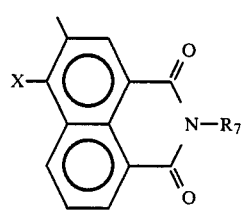

(VII)

wherein $R_7$ in the above formula (VI) and (VII) represents a substituted or non-substituted hydrocarbon group, and X is the same as defined above;

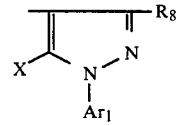

(VIII)

wherein $R_8$ represents an alkyl group, carbamoyl group, carboxyl group or its ester, and $Ar_1$ represents a cyclic hydrocarbon group or substituted cyclic hydrocarbon group, and X is the same as defined above;

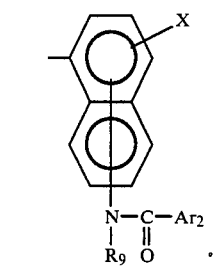

(IX)

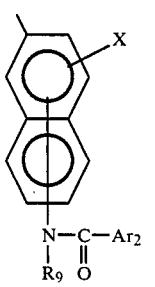

(X)

wherein R$_9$ in the above formulas (IX) and (X) represents hydrogen, hydrocarbon group or substituted hydrocarbon group, and Ar$_2$ represents cyclic hydrocarbon group or substituted cyclic hydrocarbon group.

3. A photoelectric transducer element as claimed in claim 2, wherein said coupler residue A of the general formula (I) has the general formula: (III), (VI), (VII), (VIII), (IX), or (X), and X is a hydroxyl group.

4. A photoelectric transducer element as claimed in claim 2, wherein said coupler residue A of the general formula (I) has the following general formula (XI),

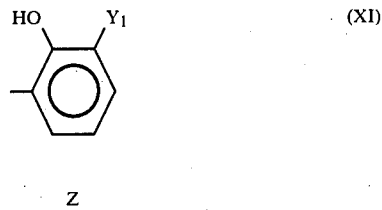

(XI)

wherein Y$_1$ and Z are the same as defined above.

5. A photoelectric transducer element as claimed in claim 2, wherein said coupler residue A of the general formula (I) has the following general formula (XII),

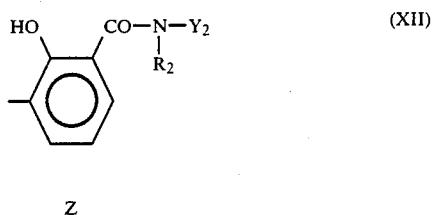

(XII)

wherein Z, Y$_2$ and R$_2$ are the same as defined above.

6. A photoelectric transducer element as claimed in claim 2, wherein said coupler residue A of the general formula (I) has the following general formula (XIII) or (XIV),

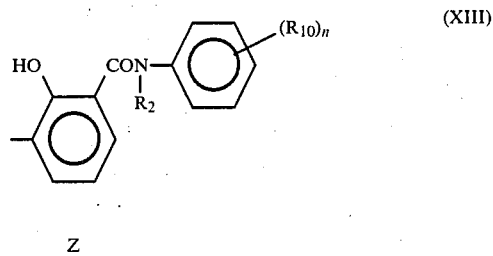

(XIII)

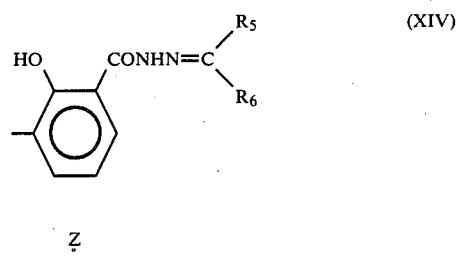

(XIV)

wherein Z, R$_2$, R$_5$ and R$_6$ are the same as defined above, and R$_{10}$ is the same as Y$_2$, and n is an integer of 0 to 5.

7. A photoelectric transducer element as claimed in claim 1, wherein said photo-active layer has a thickness of 0.01-10 μm.

8. A photoelectric transducer element as claimed in claim 1, wherein said azo pigment in said photo-active layer is contained in the form of a dispersion in a resin.

9. A photoelectric transducer element as claimed in claim 8, wherein said resin having said azo pigment dispersed therein is selected from the group consisting of polyester resin polycarbonate resin, polyamide resin, polyurethane resin, epoxy resin, alkyd resin, phenolic resin, melamine resin, acrylic resin, cellulose resin, vinyl acetate resin, vinyl chloride resin, vinylidene chloride resin, vinylidene fluoride resin, butyral resin, polyvinyl carbazol resin, polystyrene resin, polyimide resin, polyacrylonitrile resin, vinyl chloride-vinyl acetate copolymer, vinylidene chloride-acrylonitrile copolymer, styrene-maleic anhydride copolymer, and styrene-butadiene copolymer.

10. A photoelectric transducer element as claimed in claim 1, wherein said photo-active layer contains an additive selected from the group consisting of metallic oxides, charge donor materials, and charge acceptor materials.

11. A photoelectric transducer element as claimed in claim 10, wherein said metallic oxide is selected from the group consisting of zinc oxide, titanium oxide, lead oxide and alumina.

12. A photoelectric transducer element as claimed in claim 1, wherein said photo-active layer comprises two or more layers.

13. A photoelectric transducer element as claimed in claim 12, wherein said photo-active layer comprises a first layer containing said azo pigment, and a second layer containing a second charge generating pigment different from said azo pigment in order to compensate said azo pigment for a lower photosensitive wavelength zone.

14. A photoelectric transducer element as claimed in claim 13, wherein said second pigment used to compensate said azo pigment is selected from the group consisting of phthalocyanine type pigment, perylene type pigment, aromatic polycycloquinone pigment, thioindigo pigment, and quinacridone pigment.

15. A photoelectric transducer element as claimed in claim 12, wherein said photo-active layer comprises a first layer containing said azo pigment, and a second layer for forming a junction barrier with said first layer.

16. A photoelectric transducer element as claimed in claim 15, wherein said second layer for forming a junction barrier is prepared by dispersing particles in a binder resin, said particles being selected from the group consisting of zinc oxide, titanium oxide, cadmium sulfide, selenium crystal, and lead oxide.

17. A photoelectric transducer element as claimed in claim 12, wherein said photo-active layer has a layer for efficiently transferring either positive holes or electrons generated in the photo-active layer.

18. A photoelectric transducer element as claimed in claim 17, wherein said positive hole or electron transferring layer is prepared by mixing, in a resin, an electron donor as a positive hole transfer material or an electron acceptor as an electron transfer material.

* * * * *

UNITED STATES PATENT AND TRADEMARK OFFICE
CERTIFICATE OF CORRECTION

PATENT NO. : 4 672 149
DATED : June 9, 1987
INVENTOR(S) : Masao YOSHIKAWA et al

It is certified that error appears in the above-identified patent and that said Letters Patent is hereby corrected as shown below:

Column 49, lines 13-20; change formula (III) to read as follows:

--- 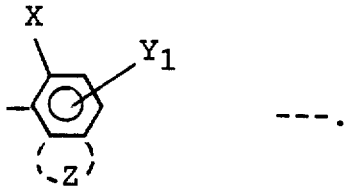 ---.

(III)

Column 49, lines 24-34; change formulas (IV) and (V) to read

--- 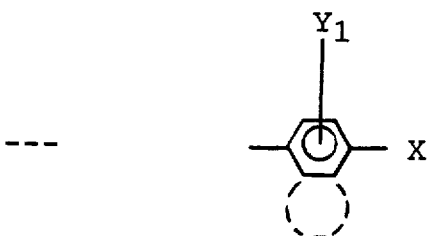   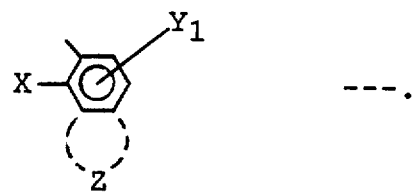 ---.

(IV)                          (V)

UNITED STATES PATENT AND TRADEMARK OFFICE
CERTIFICATE OF CORRECTION

PATENT NO. : 4 672 149
DATED : June 9, 1987
INVENTOR(S) : Masao YOSHIKAWA et al

It is certified that error appears in the above-identified patent and that said Letters Patent is hereby corrected as shown below:

Column 51, lines 13-20; change formula (XI) to read as follows:

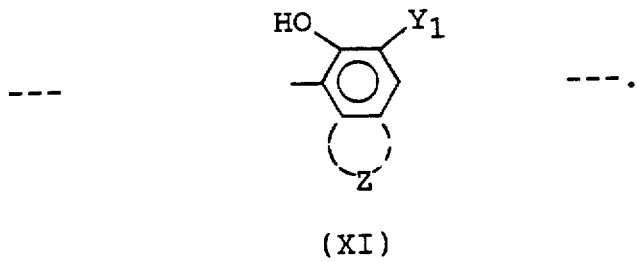

(XI)

Column 51, lines 27-35; change formula (XII) to read as follows:

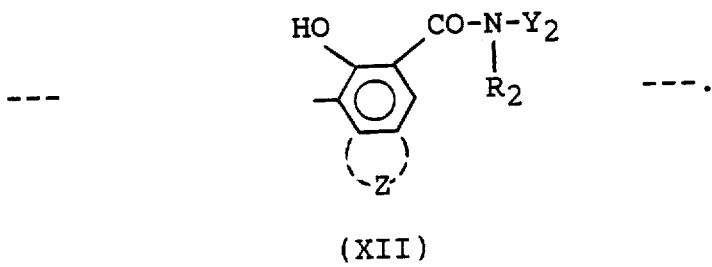

(XII)

UNITED STATES PATENT AND TRADEMARK OFFICE
CERTIFICATE OF CORRECTION

PATENT NO. : 4 672 149
DATED : June 9, 1987
INVENTOR(S) : Masao YOSHIKAWA et al

It is certified that error appears in the above-identified patent and that said Letters Patent is hereby corrected as shown below:

Column 51, lines 42-50; change the lefthand portion of formula (XIII) to read as follows:

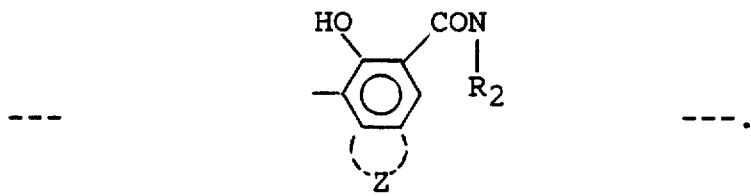

(XIII)

Column 51, lines 53-61; change formula (XIV) to read as follows:

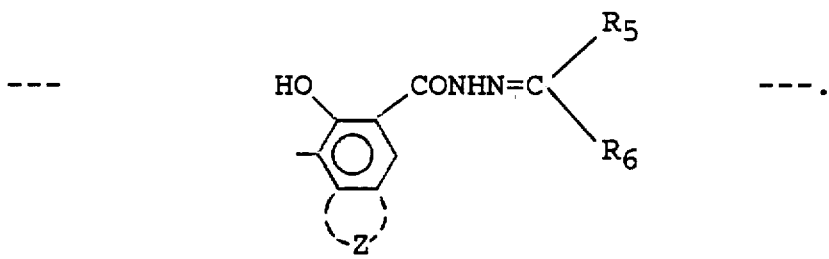

(XIV)

UNITED STATES PATENT AND TRADEMARK OFFICE
CERTIFICATE OF CORRECTION

PATENT NO. : 4 672 149

DATED : June 9, 1987

INVENTOR(S) : Masao YOSHIKAWA et al

It is certified that error appears in the above-identified patent and that said Letters Patent is hereby corrected as shown below:

Column 52, line 10; after "resin" (first occurrence) insert a comma.

Signed and Sealed this

Fifteenth Day of December, 1987

Attest:

DONALD J. QUIGG

*Attesting Officer*  *Commissioner of Patents and Trademarks*